United States Patent
Marrocco et al.

(10) Patent No.: US 8,822,633 B2
(45) Date of Patent: Sep. 2, 2014

(54) HIGH BANDGAP ARYLENE POLYMERS

(75) Inventors: Matthew L. Marrocco, Fontana, CA (US); Virgil J. Lee, Upland, CA (US); Farshad J. Motamedi, Claremont, CA (US)

(73) Assignee: Sumitomo Chemical Co., Ltd., Tokyo (JP)

( * ) Notice: Subject to any disclaimer, the term of this patent is extended or adjusted under 35 U.S.C. 154(b) by 1045 days.

(21) Appl. No.: 11/816,911

(22) PCT Filed: Feb. 22, 2006

(86) PCT No.: PCT/US2006/006565
§ 371 (c)(1),
(2), (4) Date: Aug. 5, 2008

(87) PCT Pub. No.: WO2006/091799
PCT Pub. Date: Aug. 31, 2006

(65) Prior Publication Data
US 2009/0036622 A1    Feb. 5, 2009

Related U.S. Application Data

(60) Provisional application No. 60/655,678, filed on Feb. 22, 2005.

(51) Int. Cl.
*C08G 73/24* (2006.01)
*C08G 73/00* (2006.01)

(52) U.S. Cl.
USPC ............... 528/401; 528/8; 528/422; 528/423; 526/241; 568/6; 564/305

(58) Field of Classification Search
USPC ........... 526/241; 528/8, 422, 423, 401; 568/6; 564/305
See application file for complete search history.

(56) References Cited

U.S. PATENT DOCUMENTS

| | | | |
|---|---|---|---|
| 4,382,138 A | 5/1983 | Paschke et al. |
| 5,539,048 A | 7/1996 | Gagn e et al. |
| 5,670,564 A | 9/1997 | Gagne et al. |
| 5,824,744 A | 10/1998 | Gagne et al. |
| 5,827,927 A | 10/1998 | Gagne et al. |
| 5,830,945 A | 11/1998 | Gagne et al. |
| 5,973,075 A | 10/1999 | Gagne et al. |
| 6,114,490 A | 9/2000 | Kreuder et al. |
| 6,309,763 B1 | 10/2001 | Woo et al. |
| 6,353,083 B1 | 3/2002 | Inbasekaran et al. |
| 6,723,811 B1 | 4/2004 | Holmes et al. |
| 2002/0064247 A1 | 5/2002 | Ahn et al. |
| 2002/0177687 A1 | 11/2002 | Noguchi et al. |
| 2003/0068527 A1 | 4/2003 | Noguchi et al. |
| 2004/0135131 A1 | 7/2004 | Treacher et al. |
| 2004/0170839 A1 | 9/2004 | O'Dell et al. |

FOREIGN PATENT DOCUMENTS

| EP | 0 745 658 | 12/1996 |
| WO | WO-96/29356 | 9/1996 |

OTHER PUBLICATIONS

Helms et al., "Electron Transfer in Bis-Porphyrin Donor-Acceptor Compounds with Polyphenylene Spacers Shows a Weak Distance Dependence," *J. Am. Chem. Soc.*, 114(15):6227-6238 (1992).
Kovacic et al., "Dehydro Coupling of Aromatic Nuclei by Catalyst-Oxidant Systems: Poly(*p*-phenylene)," *Chemical Reviews*, 87(2):357-379 (1987).
McGhee et al., "Narrow Bandwidth Luminescence from Blends with Energy Transfer from Semiconducting Conjugated Polymers to Europium Complexes," *Adv. Materials*, 11(16):1349-1354 (1999).
Schilling et al., "Diels-Alder Polymerization. VI. Phenylated Polyphenylenes from Bis-2-pryones and *p*-Diethynylbenzene," *Macromolecules*, 2(1):85-88 (1969).
International Preliminary Report on Patentability for International Application No. PCT/US2006/006565, dated Aug. 28, 2007.
International Search Report for International Application No. PCT/US2006/006565, dated Sep. 25, 2006.
Written Opinion for International Application No. PCT/US2006/006565, dated Sep. 25, 2006.
Yamamoto et al., "Preparation of Poly(biphenylene vinylene) Type Polymers by Ni-Promoted Polycondensation and Their Basic Optical Properties," Journal of Polymer Science Part A:Polymer Chemistry, 28:1493-1504 (2000).
Yamamoto et al., "Preparation of New Poly(phenylene vinylene) Type Polymers by Ni-promoted Polycondensation and Their Photoluminescent Properties," Chemistry Letters, pp. 613-614 (1998).
Examination Report for Application No. GB 0713745.8, dated Aug. 11, 2011.

*Primary Examiner* — Duc Truong
(74) *Attorney, Agent, or Firm* — Marshall, Gerstein & Borun LLP

(57) ABSTRACT

Luminescent polymers having sterically twisted arylene repeat units are provided, which are particularly suited as electroluminescent polymers. Monomers necessary for the synthesis of the sterically twisted polyarylene are provided, as are electroluminescent device utilizing these polymers.

15 Claims, No Drawings

HIGH BANDGAP ARYLENE POLYMERS

PRIORITY INFORMATION

This application claims priority from U.S. Provisional Application Ser. No. 60/655,678 filed Feb. 22, 2005, which is incorporated herein by reference in its entirety.

BACKGROUND OF THE INVENTION

Organic Light Emitting Diodes (OLEDs) are useful in electronic displays, building lighting, signage, and other applications where efficient, lightweight, thin form-factor light sources are needed. An OLED is formed by sandwiching a fluorescent or phosphorescent organic film between two electrodes, at least one of which is transparent. Holes from the anode and electrons from the cathode recombine in the organic film and produce light. If the organic film is a polymer film the device is a polymer-OLED or p-OLED. It is known in the art how to improve efficiency of OLEDs and p-OLEDs by inclusion of various other layers in the sandwich structure, including but not limited to hole injection layers, hole transport layers, buffer layers, electron injection layers, electron transport layers, hole blocking layers, electron blocking layers, exciton blocking layers, optical layers to increase light extraction efficiency, and the like. It is also known in the art that the properties of the organic film, or emissive layer, must be carefully designed to 1) allow transport of holes, 2) allow transport of electrons, 3) prevent non-radiative decay of the excited state, and 4) ensure that no irreversible chemical reactions occur during device operation. Requirements 1-3 relate to device efficiency and requirement 4 relates to device lifetime. The emissive layer will often be comprised of several substances or components, including one or more charge carriers, a fluorescent or phosphorescent material, and a more or less inert matrix.

While theory suggests that OLEDs and p-OLEDs can have high efficiencies, commercial devices still have lower efficiencies than conventional fluorescent bulbs. In practice, the efficiency of a device is dependent on color and is related to the sensitivity of the human eye, so that green devices are inherently more efficient than red or blue emitting devices, however, improvement in efficiency of all colors is desired. One cause of low efficiency is energy transfer from the excited emissive compound (whether it be fluorescent or phosphorescent, small molecule, or polymer) to a material having a lower energy excited state. Materials with lower energy excited states may be, for example, impurities, defects, or excimers. It often occurs that the matrix has a first triplet excited state that is lower in energy or only slightly above the emissive material's excited state and a first singlet-excited state that is higher than the emissive material's excited state. It would be desirable to reduce or eliminate energy transfer from the desired excited state to other lower energy excited states and to eliminate energy transfer from the desired excited state to the triplet state of the matrix material.

The decreasing brightness of OLEDs and p-OLEDs as a function of time is the major obstacle to commercial application. Many factors affect lifetime. An important factor appears to be the redox stability of the emissive layer (that is, the stability of the reduced and oxidized states of the materials in the emissive layer). While not wishing to be bound by theory, it is believed that as holes propagate through the emissive layer they take the form of cations or radical cations. A radical is a molecule having an odd number of electrons and may be charged (an anion or cation) or neutral (a free radical). Radicals are generally more reactive than molecules with an even number of electrons. As electrons propagate through the emissive layer, they take the form of anions or radical anions. Radical cations may dissociate into a cation and a free radical, while radical anions may dissociate into an anion and a free radical. Cations, radical cations, anions, radical anions, and free radicals are all reactive species and may undergo unwanted chemical reactions with one another or with nearby neutral molecules. Such chemical reactions alter the electronic properties of the emissive layer and can lead to decreases in brightness, efficiency, and (ultimately) device failure. For this reason, it would be desirable to reduce or eliminate chemical reactions of these active species in OLEDs and p-OLEDs.

Even the most promising p-OLED materials are limited by short lifetimes. For example, copolymers of methylene-bridged polyphenylenes (also called polyfluorenes) and other arylene units, Q (such as 4,4'-triphenylamine, 3,6-benzothiazole, 2,5(1,4-dialkoxyphenylene), or a second bridged biphenyl unit) are frequently used in p-OLED applications. While green emitting p-OLEDs based on such polyfluorene copolymers have been reported to have lifetimes of over 10,000 hours, red and blue emitting p-OLEDs based on these systems are shorter lived. Lifetime is generally measured as the time to half brightness at a set current density, starting at 100 cd/m². In fact, the lifetimes of the best polyfluorene blue phosphors are not suitable for commercial p-OLED applications. For this reason, it would be desirable to improve emissive materials, especially those that emit in the blue color range.

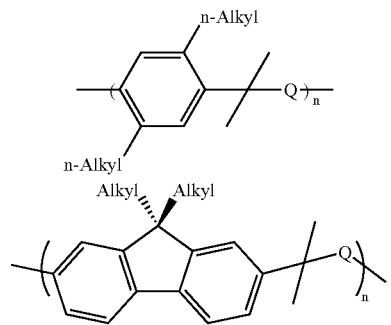

General structures 1 and 2 for polyphenylene (top, General Structure 1) and methylene bridged polyphenylene (bottom, General Structure 2), where Q is an arylene.

In polyarylene-type green and red emissive polymers (including polyfluorene as a subclass of polyarylene) the emissive center is typically a special repeat unit selected to have a first singlet-excited state of appropriate energy to emit green or red. In polyarylene type blue emissive polymers (including polyfluorenes) the emissive center is typically one or more adjacent phenylene (or bridged biphenylene) repeat units. In this case, the phenylene (or bridged biphenylene) backbone has the lowest singlet-excited state out of all the repeat units or other materials present. That is, the majority repeat unit is the emitter. This means that excited states spend most of their time on the majority repeat unit. Since excited states are more reactive than ground states the majority repeat units are prone to undergo undesired reactions.

SUMMARY OF THE INVENTION

One aspect provided in the present invention are polymer materials having twisted biarylene units that increase the first singlet- and triplet-excited states relative to similar polymers lacking such sterically twisted structures.

Another aspect provided in the present invention is a polymer material having sterically twisted biarylene units that are suitable as host matrixes for fluorescent and phosphorescent emitters for use in p-OLED applications.

Another aspect provided in the present invention is an oligomeric maternal comprised of sterically twisted biarylene units that are suitable as host matrixes for fluorescent and phosphorescent emitters for use in p-OLED applications.

Another aspect provided in the present invention is a copolymer material comprised of sterically twisted biarylene repeat units and fluorescent or phosphorescent repeat units.

Another aspect provided in the present invention is a copolymer comprised of 1) sterically twisted biarylene repeat units, 2) fluorescent or phosphorescent repeat units, and 3) hole and/or electron transport repeat units.

It is another objective of the present invention to provide OLED and p-OLED devices with improved brightness and/or lifetime.

DETAILED DESCRIPTION OF THE INVENTION

One object of the present invention is to provide a blue emissive polymer with a long lifetime. The lifetime to half brightness starting at 100 cd/m² should be greater than 1,000 hours, preferably greater than 2,000 hours, more preferably greater than 5,000 hours, even more preferably greater than 10,000 hours, and yet more preferably greater than 20,000 hours. P-OLED devices are often tested at higher initial brightness as an accelerated ageing test. The lifetime to half brightness starting at 1,000 cd/m² should be greater than 100 hours, preferably greater than 200 hours, more preferably greater than 500 hours, even more preferably greater than 1,000 hours, and yet more preferably greater than 2,000 hours.

While not wishing to be bound by theory, the short lifetime of current state-of-the-art blue emissive polyphenylenes and bridged polyphenylene is likely due to the polymer serving as the emissive center. If the polymer itself has the lowest lying singlet level, then it must carry the exciton (excited state) for a longer period of time than if it transfers its energy to an emitter with a lower level. Having this exciton reside on the polymer for long periods of time has several deleterious effects. First, since the excited state is a very chemically reactive species, an opportunity is provided for the majority of repeat unit of the polymer backbone to react irreversibly. Second, the time that the excited state spends on the main polymer repeat unit is increased, further increasing the chance of side reactions. Third, it is more difficult to protect an excited state that is spread across the whole polymer backbone than one isolated on an occasional (typically from 10 mol % to 1 mol % or less) emissive repeat unit. Finally, it is more difficult to change the color of emitted light (that is, to prepare a polymer modified to emit a different color) if the majority polymer repeat unit is emitting than if a minority polymer repeat unit is emitting.

Designing a useful polymer in which the bulk of the backbone structure does not serve as the emitting unit in p-OLED applications has met with limited success. Lower energy green and red phosphors have been achieved from methylene-bridged polyphenylene copolymers because the lower energy lowest lying singlet-energy levels of the individual polymer units are higher than that of the emissive repeat unit. This suggests that excitons that are formed on the polymer units within these green or red systems are short lived because they quickly transfer their energy to the lower energy emissive repeat units, giving rise to longer lifetimes. This is not the case with higher energy blue phosphors because the lowest singlet-energy levels of the individual polymer units are comparable to those of the emissive repeat units. This means that excitons reside for longer periods on the backbone units of blue phosphors leading to deleterious side reactions, which accounts for the shorter lifetimes of these systems.

Electronic conjugation is a key component to the energy level of polymer repeat units with more conjugated systems having lower energies. In this context, there are two contributing factors to conjugation: 1) the conjugation of the repeat unit itself, and 2) the conjugation of the repeat unit with adjacent aromatic units. Both of these contributing factors can be seen in polyfluorene copolymers (compare Structures 3 and 4). In these systems, the methylene bridge of the fluorene unit holds two adjacent phenylene units in a planar configuration (zero twist) giving rise to the maximum possible conjugation between these two units and the lowest possible energy. Additionally, the fluorene Polyfluorene (Structure 3, top) and Polyphenylene (Structure 4, bottom) Copolymers Emphasizing the Polymer Twist

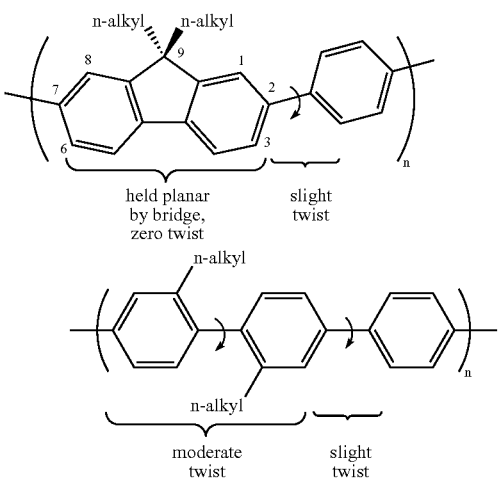

units in these systems generally have only small hydrogen substituents at positions ortho to the polymer backbone, which also give rise to increased conjugation and lower energy. In typical polyphenylene systems one or two out of the four ortho positions is substituted with a straight chain alkyl or alkoxy group, causing some twist. In the practice of the present invention groups larger than n-alkyl are used, or three or four of the ortho positions are substituted, and larger twists, approaching 90° are generated, and a significant increase in bandgap results.

A key aspect of this invention are sterically twisted polyarylene polymer systems that offer higher energy repeat units. This is accomplished by decreasing both the conjugation of the polyarylene repeat by forcing adjacent aryl groups out of planarity. In General Structure 5 the twist angle between the rings shown depends on the size of substituents $R_2$, $R'_2$, $R_6$ and $R'_6$.

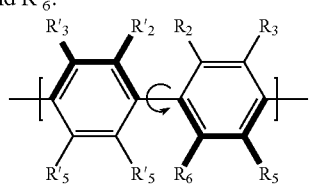

General Structure 5 Showing Two Aryl Repeat Units

The rings will have a large enough twist (called herein a "Sterically Twisted Biarylene" (STB) group, unit, or repeat unit) to be useful for the practice of the present invention if:

1) at least two of $R_2$, $R'_2$, $R_6$ and $R'_6$ are not —H and
at least one of $R_2$, $R'_2$, $R_6$ and $R'_6$ is selected from the group consisting of —$CR_7R_8R_9$, —$OR_{10}$—$NR_{10}R_{11}$, —$SR_{10}$, —$SiR_{11}R_{12}R_{13}$, and bridging with either $R_3$, $R'_3$, $R_5$ and $R'_5$ respectively, where $R_7$ is selected from the group consisting of —H, alkyl, aryl, heteroalkyl, heteroaryl, fluoro, chloro, alkoxy, aryloxy, cyano, fluoroalkyl, fluoroaryl, where $R_8$ and $R_9$ are independently selected from the group consisting of alkyl, aryl, heteroalkyl, heteroaryl, fluoro, chloro, alkoxy, aryloxy, cyano, fluoroalkyl, fluoroaryl, where $R_{10}$ is selected from the group consisting of —$CR_7R_8R_9$, and where $R_{12}$ and $R_{13}$ are selected independently from the group consisting of —H, alkyl, aryl, heteroalkyl, heteroaryl, fluoroalkyl, and fluoroaryl, or 2) at least three of $R_2$, $R'_2$, $R_6$ and $R'_6$ are not —H, and optionally, any of $R_2$, $R'_2$, $R_6$ and $R'_6$ may form a bridge or multiple bridges with $R_3$, $R'_3$, $R_5$ and $R'_5$ respectively, and any $R_3$, $R'_3$, $R_5$ and $R'_5$ may form a bridge or multiple bridges with R groups on repeat units adjacent to those shown in General Structure 1, and any carbon atom and its associated R group in the rings of General Structure 1 may be replaced by nitrogen to form a heterocycle, and any of $R_7$, $R_8$, $R_9$ $R_{10}$, and $R_{11}$ may form a bridge or multiple bridges with any other R group, and where here and throughout fluoroalkyl and fluoroaryl may be mono, di, poly, or per fluorinated.

$R_3$, $R'_3$, $R_5$ and $R'_5$ may be any group, including but not limited to H, alkyl, aryl, heteroalkyl, heteroaryl, fluoro, chloro, alkoxy, aryloxy, cyano, fluoroalkyl, fluoroaryl, ester, amide, imide, thioalkyl, thioaryl, alkylketone, and arylketone.

Examples of bridging groups between $R_2$ and $R_3$, $R'_2$ and $R'_3$, $R_5$ and $R_6$, and $R'_5$ and $R'_6$ are —$CR_7$=$CR_7$—$CR_7$=$CR_7$—, —$CR_7$=$CR_7$—$CR_7$=N—, —$CH_2CH_2CH_2CH_2$—, —$OCH_2CH_2O$—, =N—S—N=(i.e. the arylene group is benzothiadiazole), and —S—CH=CH—, A non-limiting example of $R_3$ bridging to an adjacent repeat unit is:

Structure 6

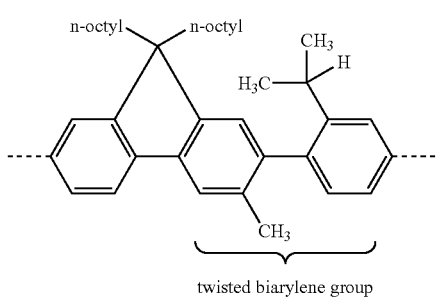

twisted biarylene group

In the above structure $R_6$ is methyl and $R'_2$ is isopropyl.

In one embodiment of the present invention is provided a polymer comprising on the average at least one dyad per chain of the structure:

Structure 7

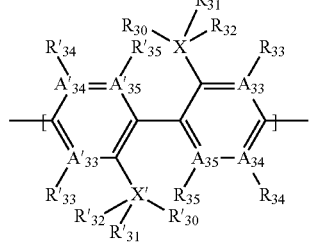

where $R_{30}$, $R_{31}$, $R_{32}$, $R_{33}$, $R_{34}$, $R_{34}$, $R'_{30}$, $R'_{31}$, $R'_{32}$, $R'_{33}$, $R'_{34}$, and $R'_{35}$ are independently selected from the group consisting of hydrogen, alkyl, aryl, heteroalkyl, heteroaryl, fluoroalkyl, fluoroaryl, alkylketone, aryl ketone, alkoxy, and aryloxy, X and X' are independently selected from the group consisting of C, N, O, Si, P, and 1, if X is C and $R_{35}$ and $R'_{35}$ are H then $R_{30}$ and $R_{31}$ are not H, if X is N or P then $R_{30}$ is nil and $R_3$, has a secondary or tertiary carbon bonded to X, if X' is N or P then $R'_{30}$ is nil and $R_{31}$ has a secondary or tertiary carbon bonded to X', if X is O or S then $R_{30}$ and $R_{31}$ are nil and $R_{32}$ has a secondary or tertiary carbon bonded to X, if X' is O or S then $R'_{30}$ and $R'_{31}$ are nil and $R'_{32}$ has a secondary or tertiary carbon bonded to X', $A_{33}$, $A_{34}$, $A_{35}$, $A'_{33}$, $A'34$, and $A'_{35}$, are independently-selected from C or N, where if A is N the corresponding R is nil, any of $R_{30}$-$R_{33}$ independently may be bridging with one another, $R_{34}$ may be bridging with $R_{35}$, any of $R'_{30}$-$R'_{33}$ independently may be bridging with one another, $R'_{34}$ may be bridging with $R'_{35}$, and any of $R_{33}$, $R_{34}$, $R'_{33}$ and $R'_{34}$ may be bridging with a repeat unit adjacent to the dyad.

In this embodiment the R groups may form saturated or unsaturated fused rings. For example, forming naphthyl or phenanthryl repeat units. In order to maintain a sufficient twist the number of R groups ortho to the central dyad bond must be three or four, or if only two then at least one of the R groups should be larger than a simple straight chain alkyl, and in the case of X=C should have a tertiary or quaternary carbon as X, and in the case of O, N, S, or P, should have a secondary or tertiary carbon bonded to X (that is to the O, N, S, or P respectively).

In order to maintain good charge transport properties it is desirable that a significant portion of the repeat units be arylene or other conjugated units (e.g. ethylene, acetylene, arylamine, thiophene), preferably more than 25% of the units will be arylene or other conjugated units, more preferably more than 45% and most preferably more than 65%.

In order to maintain a high bandgap a significant portion of the dyads should be sterically twisted dyads represented by Structure 7, preferably more than 10% of the dyads, more preferably more than 20%, even more preferably more than 30%, yet more preferably more than 40%. Higher amounts of sterically twisted dyads may be incorporated into the instant polymers, including but not limited to 50% of the dyads, 75% of the dyads, and even 100% of the dyads. Note that a homopolymer may have 50% of the dyads twisted, or more. Note that a homopolymer may have a random regio-chemistry such that not all dyads are head-to-head or head-to-tail, and the number of twisted dyads may have a statistical distribution.

Particular non-limiting examples of sterically twisted biarylene polymers are given by:

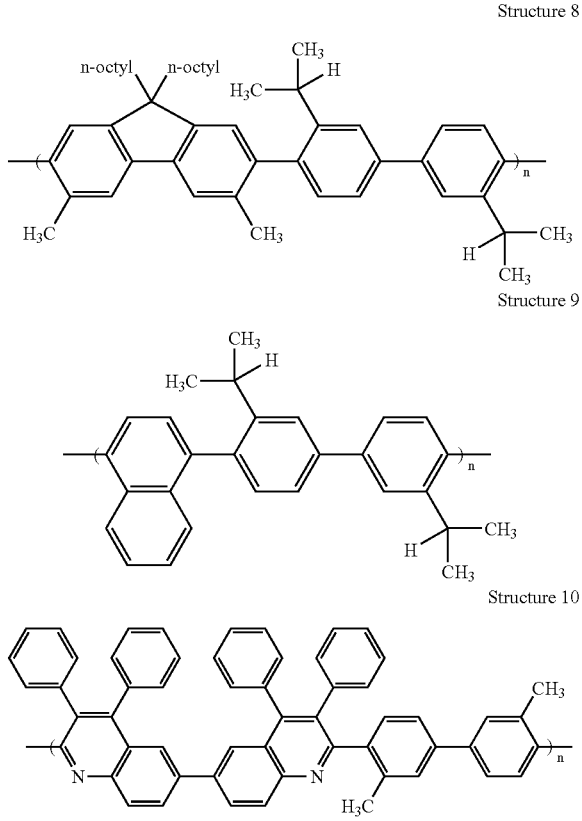

Structure 8

Structure 9

Structure 10

As in the example immediately above the arylene group may be a bicyclic or polycyclic fused ring group, and may contain heteroatoms.

The polymers may be prepared by any of various aryl-aryl coupling methods, preferably by Suzuki coupling. The general monomer structure is:

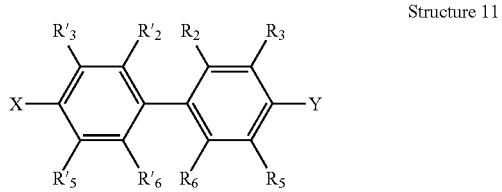

Structure 11 where X and Y are selected independently from Cl, Br, I, B(OH)$_2$, B(OR$_{12}$)$_2$, and OS(O)$_2$R$_{13}$, where R$_{12}$ is alkyl, aryl, and the two R$_{12}$ may be bridging to form a ring, and R$_{13}$ is alkyl, aryl, fluoroalkyl and fluoroaryl, preferably fluoroalkyl.

X and Y may also be selected from MgX, ZnX, Li, Sn(R$_{14}$)3 and the like, where X is halogen, for example, for use in Yamamoto coupling polymerization, Negishi coupling polymerization, or Stille coupling polymerization, where R$_{14}$ is selected independently from H, halide, and alkyl.

The singlet and triplet states of polymers comprising sterically twisted arylene repeat units are higher than those of conventional polyarylenes, polyphenylenes, and polyfluorenes. The singlet energy may be greater than approximately 3 eV (413 nm), preferably greater than about 3.1 eV (400 nm), and more preferably greater than about 3.2 eV (388 nm).

Polymers comprising sterically twisted biarylene segments may also contain emissive repeat units with singlet energy in the visible, IR or UV range. For example, the emissive repeat unit may have peak emission of about 410 nm to 450 nm n that will emit blue light. These blue emissive repeat units may be present at a relatively small mole fraction, preferable less than 10 mole %, more preferably less than 8 mole %, even more preferably less than about 6 mole %, yet more preferably less than 5 mole %. Lower levels of blue emissive repeat units may also be practical, including less than 4 mole %, less than 2 mole %, less than 1 mole % and even less than 0.5 mole %.

There are various ways to improve the stability of emissive units of the proposed invention. Such emissive repeat units may be protected, using methods known in the art, to prevent reaction of these units with one another or other components of the emissive layer. For example, the emissive repeat unit may have large inert substituents including but not limited to alkyl, aryl, heteroalkyl, and heteroaryl. Particular examples of such inert substituents include but are not limited to t-butyl, phenyl, pyridyl, cyclohexyloxy, and trimethylsilyl. Attaching inert substituents at reactive positions on the unit can also stabilize emissive units. For example, it is known that the triphenylamine cations reacts primarily at the 4, 4', and 4"-positions of the phenylene units (those para to the nitrogen). It is also known that substituting these positions with, for example, alkyl groups prevents these reactions and greatly increases the lifetime of the radical cation. One skilled in the art will know how to find the reactive positions by making and testing chemical model compounds or by computational modeling, and how to substitute these reactive positions with inert substituents like alkyl (e.g. methyl, t-butyl) or fluoro, or to replace the reactive —CH= group with —N= (e.g. replace phenyl with pyridyl). Emissive units can also be made stable if they are able to delocalize charge over a larger number of atoms. For example, a triphenylamine cation is more stable than an allyldiphenylamine cation since the charge on the former delocalizes over three phenyl rings, as opposed to only two phenyl rings in the latter. Finally, incorporating bulky groups on adjacent repeat units can protect emissive repeat units.

This combination of twisting of adjacent arylene units, transfer of energy to a minority emissive repeat unit, and protection of emissive units leads to longer OLED and p-OLED device lifetimes. Additionally, raising the singlet- and triplet-energy levels of the polymer or oligomer by sterically twisting reduces or eliminates non-radiative pathways and increases brightness and efficiency.

One embodiment of this invention involves a homopolymer or copolymer having a molecular weight of greater than about 1,000 comprising a twisted biphenyl unit having the structure:

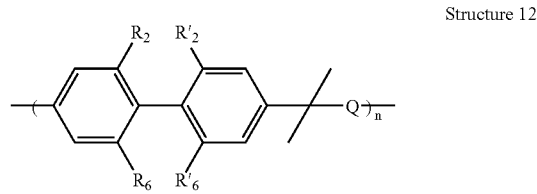

Structure 12 where R2, R'2, R6 and R'$^6$ are as defined above, for example, R2, R'2, R6 and R'16 are all i-propyl.

In one aspect of the present invention the Sterically Twisted Biarylene (STB) polymers are non-linear and contain branch points. One advantage of non-linear polymers is that polymer mixtures or blends are easier to prepare. For example, if two dendrimeric or hyperbranched polymers have dissimilar cores but similar shells they will tend to be miscible. Another advantage is that the central core is protected by an outer shell structure. A further advantage is that the electronic properties of the core and one or more shells may be varied independently, for example, a hyperbranched polymer might have an emissive core, a hole transporting inner shell, and an electron transporting outer shell. Light branching or crosslinking also may be advantageous for control of MW and viscosity.

A non-limiting example of a STB polymer having a branched structure is given by:

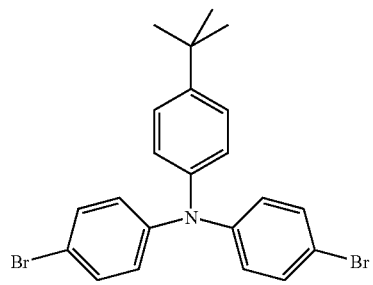

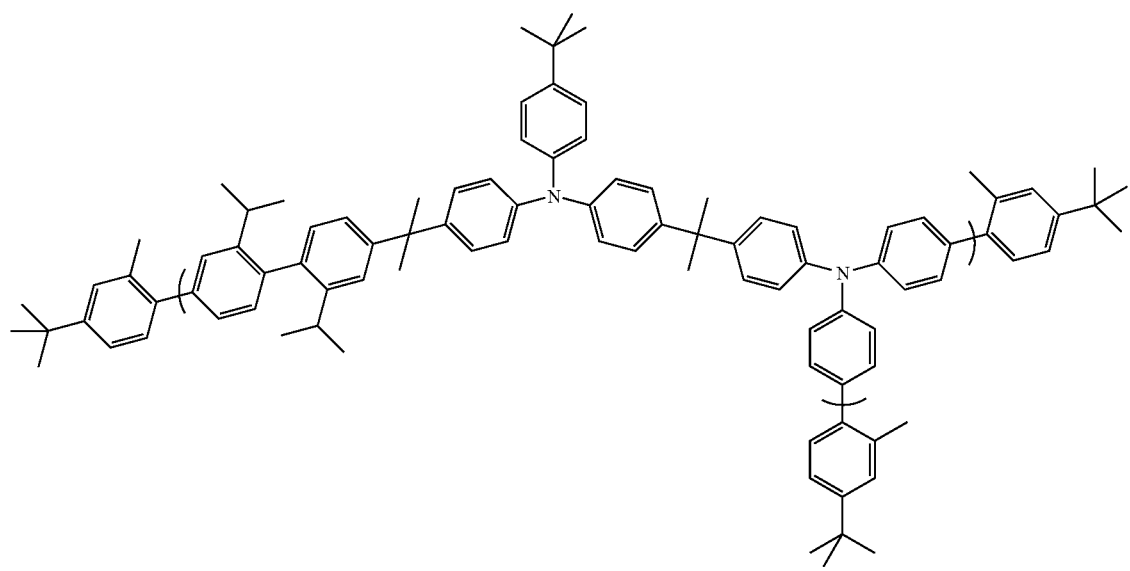

Structure 13

The branched polymers of the present invention may be prepared by the inclusion of a trifunctional or polyfunctional monomer along with the difunctional monomers. For example, Structure 13 may be prepared by Suzuki coupling of the following monomers and endcapping agent:

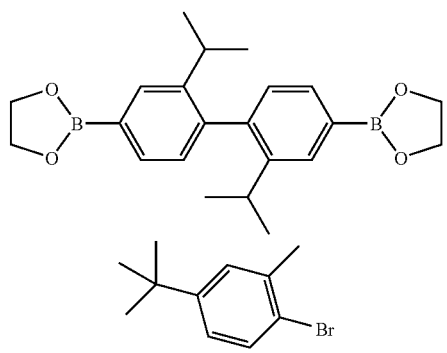

-continued

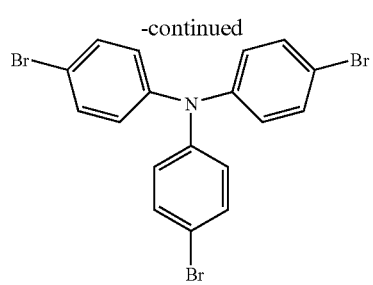

The degree of branching may be controlled by adjusting the relative amount of tribromophenylamine. It will be also understood that the molecular weight is controlled by the relative amount of endcapping agent and the ratio of diboronic ester monomers and dibromo monomers. One unusual feature of Suzuki polymerization is that the monomer ratio giving the highest MW is often offset in favor of the diboronic ester. This is likely due to some homocoupling of boronic esters. One reasonably skilled in the art will know how to adjust the monomer ratio, the amount of endcapping agent, and the amount of crosslinking monomer to obtain a higher or lower MW.

The present invention also relates to linear polymers comprising sterically twisted arylene units and reactive end groups or side groups that may be induced to form non-linear structures through reaction at the reactive end groups or side groups. Polymers having reactive side groups are disclosed in U.S. Pat. Nos. 5,539,048 and 5,830,945 incorporated herein in full by reference. Polymers having reactive end groups are disclosed in U.S. Pat. Nos. 5,670,564; 5,824,744; 5,827,927; and 5,973,075 all incorporated herein in full by reference.

Non-limiting examples of STB polymers having a reactive side group are given by:

the lower layers is to crosslink the lower layers prior to application of upper layers. The non-linear, crosslinked layers are impervious to solvent and subsequent processing steps.

Polymers and co-polymers of the present invention may be linear, branched, hyperbranched, dentritic, graft, comb, star, combinations of these or any other polymer structure. Polymers of the present invention may be regio-regular, regio-random or combination. Polymers of the present invention may be head-to-head, head-to-tail, or mixed head-to-head/

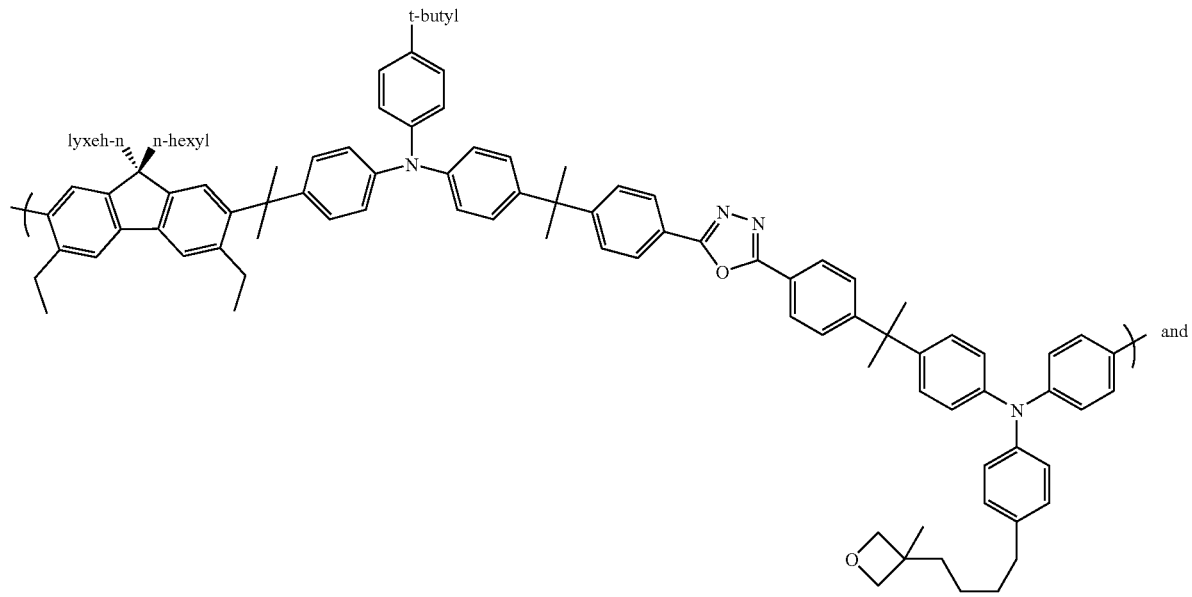

Structure 14

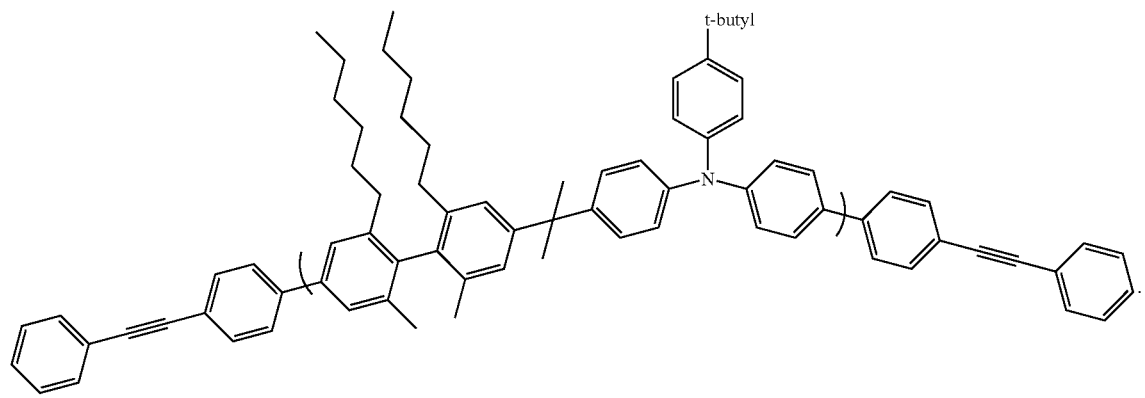

Structure 15

Branched, hyperbranched, and dendritic polymer may also have reactive groups.

In addition to formation of branched structures, polymers having reactive side groups or reactive end groups may be crosslinked into an insoluble network, sometimes called thermosets. Crosslinked polymers offer several advantages over uncrosslinked polymers, especially for applications in the area of OLEDs and p-OLEDs. For example, p-OLEDs typically consist of multiple layers polymers, each being very thin, typically between 50 nm and 1,000 nm. During fabrication, polymer layers must be deposited over previously formed polymer layers. The underlying layer must not dissolve in or be disturbed by the polymer solution being applied to form the upper layer. One method to prevent disturbance of head-to-tail. Co-polymers of the present invention may be alternating, random, block, or combination of these. Polymers of the present invention may be chiral or contain chiral repeat units. Any combination of chiral repeat units is contemplated, including all chiral units of a single handedness, a racemic mixture of units, or a mixture (e.g. from partially resolved chiral monomers). Chiral units may be desirable to induce polarization of the emitted light. Polarized OLEDs and p-OLEDs may have application in LCD backlighting, eliminating the need for one of the LCD display polarizers. Since polarizers absorb some of the incident light elimination of a polarizer can increase efficiency.

In one embodiment of the present invention a polymer comprises at least one Sterically Twisted Biarylene (STB)

repeat unit, at least one luminescent compound, L, and optionally other repeat units Q.

The luminescent dye may be incorporated into the polymer in any fashion. Non-limiting examples of structural types include:

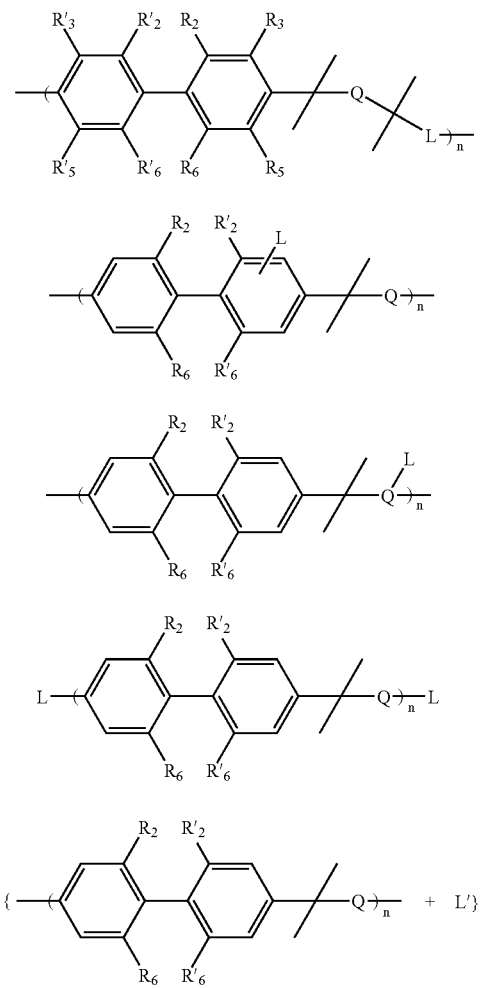

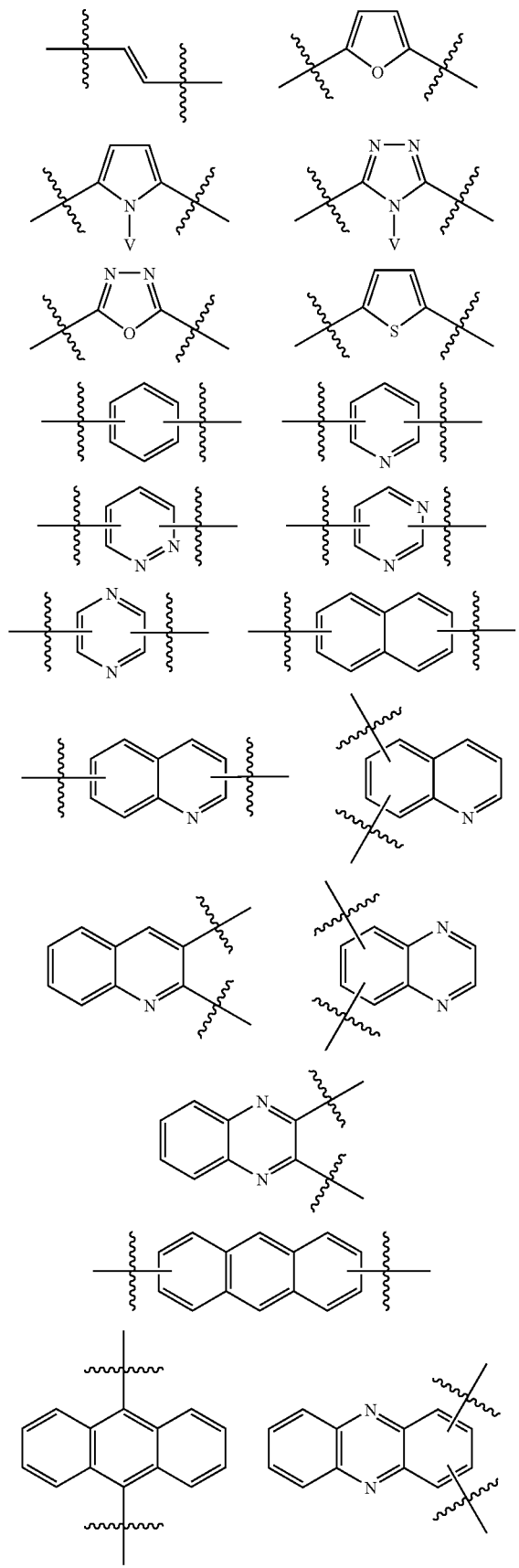

Where X is as defined above,

Q is nil, or any conjugated repeat unit, where structures I-V are copolymers they may be any combination of alternating, block, or random, L is any luminescent compound or group, and where if L is part of a polymer chain backbone as in structure I L is divalent, if L is attached to a polymer as in structures II-V L is monovalent, and if part of a blend as in structure V, zero valent (i.e. not sharing any bonds with the STB polymer chain) and in Structure II L may be chemically attached directly to the aromatic ring or to any of $R_2$, $R'_2$, $R_6$ and $R'_6$. The structure may represent homopolymers, for example the STB units and Q are perfectly alternating, co-polymers comprising any number of types of repeat units, random, block, regio-regular, regio-random, graft, comb, branched, hyperbranched, dendritic, crosslinked or any combination of structures.

Non-limiting examples of conjugated repeat units, Q, include:

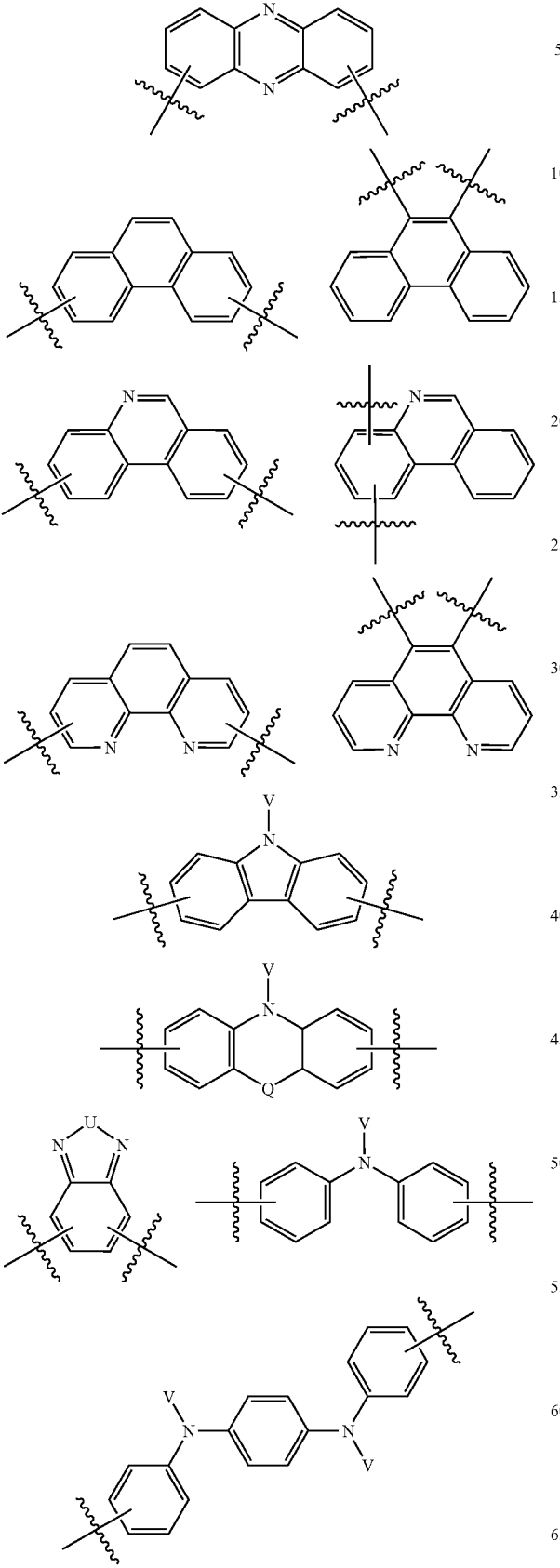
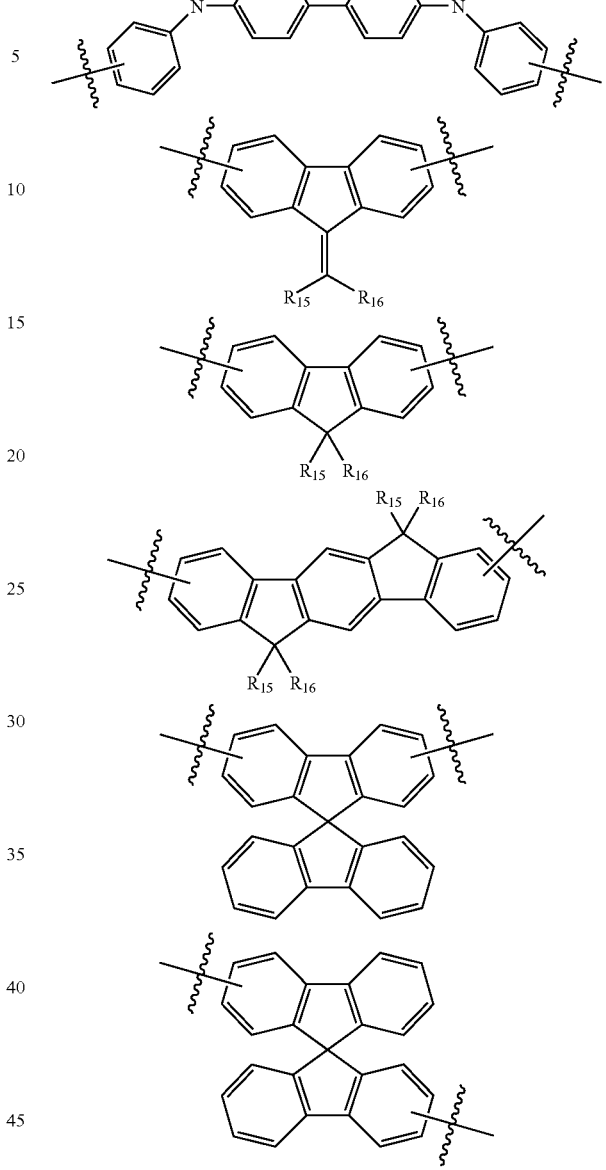

In structure I the luminescent unit, L, is a divalent unit, and is part of the main chain. In structure II luminescent unit, L, is a monovalent unit appended from any position of the STB unit, including any position on the biarylene moiety and any position on any of the bridging moieties. In structure III the luminescent unit, L, is a monovalent unit appended from at least one of the repeat units Q. In structure IV the luminescent unit, L, is an end group. In structure V the luminescent compound is not chemically attached to the polymer, but is present as a component of a polymer blend or mixture. In structure V the luminescent compound may be a small molecule that is dissolved in the polymer matrix. In another embodiment of structure V the luminescent compound is an oligomer or polymer blended in with the STB containing polymer. Where L is part of a blend or mixture other compounds may be present to increase solubility or compatibility of L with the STB containing polymer. L need not be fully soluble or compatible with the STB containing polymer if the fabrication method results in a non-equilibrium state wherein L is trapped in the polymer and kinetically prevented from crystallizing or separating.

There will be at least one STB unit on the average in each polymer chain, however, preferably there are at least 10 mol % STB units, more preferably at least 20 mol % STB units, and most preferably at least 25 mol % STB units. There may be up to 99.99 mol % STB units. There may be anywhere between 0 and 99 mol % Q units, preferably between 0 and 50 mol %. There may be 0.01 to 50 mol % luminescent units L, more preferably between about 0.1 and 25 mol %, even more preferably between about 0.2 and 15 mol % luminescent L units, and most preferably between about 0.5 mol % and 5 mol % luminescent L units.

In the compositions of the present invention the luminescent component, L, will have an emission at longer wavelength (lower energy) than the STB polymer component. As is known in the art (see for example, M. D. McGehee, T. Bergstedt, C. Zhang, A. P. Saab, M. B. O'Regan, G. C. Bazan, V. I. Srdanov, and A. J. Heeger, *Adv. Materials*, 1999, 11(6), 1349-1354) if a luminescent material of lower energy is embedded in a matrix that is luminescent at higher energy (in the absence of L), then energy is transferred from the matrix to the luminescent material and emission from the luminescent material dominates. This seems to be especially effective in EL devices where luminescence from the matrix may be completely absent, being transferred with high efficiency to L, even when luminescence from both matrix and L are present in the photoluminescent spectrum. It is sometimes said that the luminescence of the matrix is quenched by L.

For the practice of the present invention all or part of the luminescence of the matrix may be quenched by L, preferably 20%, more preferably 40%, even more preferably 60%, yet more preferably 80%, even yet more preferably 90%, even more preferably 95%, and most preferably more than 99% of the matrix luminescence is quenched (or otherwise reduced) by the presence of L. It may be that within experimental error 100% of the luminescence of the matrix is quenched by L.

Transfer of energy to a luminescent component is desirable because 1) the luminescent component may be protected to reduce or eliminate chemical reactions of the excited state, 2) energy does not reside on the majority backbone repeat unit making undesirable chemical reaction of the majority repeat units less likely, and 3) a single matrix repeat unit may be used with various luminescent repeat units to generate many colors.

Luminescent materials, groups, dyes, or pigments may be selected from any luminescent material, group, dye or pigment known in the art. A non-limiting example of a luminescent dyes is stilbene:

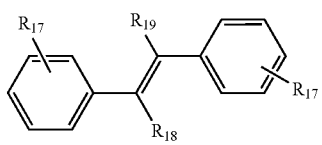

Structure 16 where each ring may have 0-5 $R_{17}$ groups which may be monovalent or divalent, or may provide a link to a polymer, and where any two $R_{17}$-$R_{19}$ taken together may be bridging. Monovalent R means the group R has only one linking bond. Non-limiting examples of monovalent R are methyl, hexyloxy, and 4-t-butylphenyl. Divalent R means the group R has two linking bonds. Non-limiting examples of divalent R are —$CH_2$— (methylene), —$CH_2CH_2CH_2$—(1,3-propylene), 1,2-phenylene, and —$OCH_2CH_2O$— (ethylenedioxy). For example, a specific monovalent stilbene is ($R_{17}$ is alkyloxy, $R_{18}$ is cyano, and a second $R_{17}$ is divalent alkyl providing a link to the polymer chain):

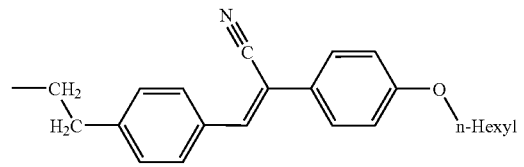

Structure 17 a specific divalent stilbene, where two of the divalent R are bridging ($R_{17}$ and $R_{18}$ are bridging and additional two $R_{17}$ provide links to the polymer chain), is:

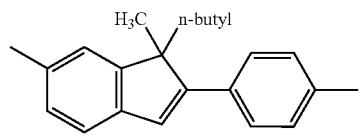

Structure 18

Similarly, other non-limiting examples of luminescent dyes are: anthracene, tetracene, phenanthrene, naphthalene, fluorene, binaphthalene, biphenyl, terphenyl, quaterphenyl, bisthiophene, biquinoline, bisindene, and the like, where any of the hydrogens may be independently substituted by monovalent or divalent R, or may provide a link to a polymer, where any two R taken together may be bridging.

Non-limiting specific examples of luminescent dyes include:

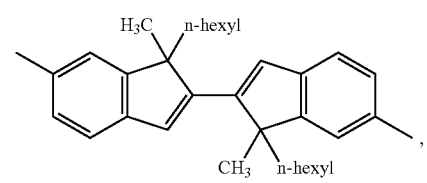

Structure 19

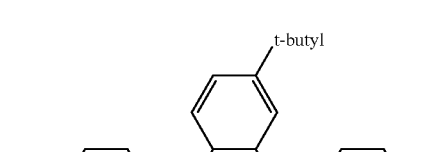

Structure 20

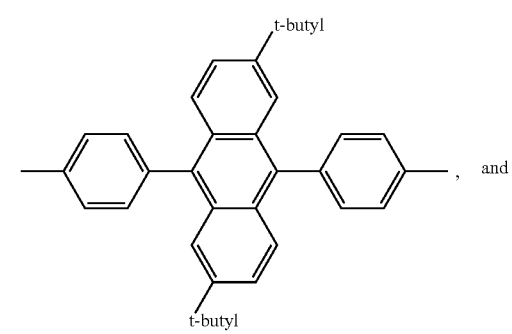

, and

Structure 21

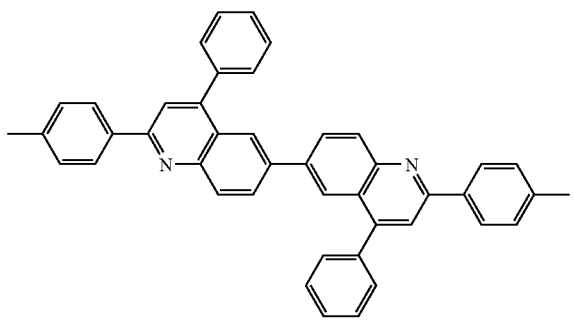

Additional luminescent dyes are disclosed in U.S. Pat. No. 6,723,811 incorporated herein by reference.

It will be understood by one reasonably skilled in the art that for luminescent materials that are phosphorescent, that is, for those that emit from a triplet level, the relevant energy level of the STB polymer is also the triplet level. That is, the lowest triplet level of the STB polymer must have a higher energy than the triplet of the luminescent material. This limit on the triplet level is much more restrictive, since the triplet is nearly always lower than the singlet level. Nevertheless, the triplet level is expected to increase with the singlet level, and a "bluer" or higher energy triplet emitter can be supported with the STB polymers of the present invention than with the corresponding less twisted or untwisted polymer. For example, it may be possible to realize a green triplet emitter with a STB polymer where the corresponding untwisted or less twisted polymer cannot because its triplet is too low. Thus in one embodiment of the present invention a phosphorescent emitter is bound to or mixed with a STB polymer. For example, a green emitting iridium bisphenylpyridine emitter is coordinated to an acetylacetone group linked to a STB polymer to provide a green emitting EL phosphor:

where the mole ratio of STB/triphenylamine/Ir repeat units is 74/22/4, and the STB and Ir containing repeat units are regiorandom.

One way to determine if a luminescent compound is useful in the practice of the present invention is to compare the visible emission spectrum of the polymer in the presence of L to that of the polymer in the absence of L. Useful L will effectively quench the polymer matrix photoluminescence or electroluminescence. Thus the emission spectrum of the polymer in the presence of L will have average energy in the visible range (400 nm to 650 nm) red-shifted by at least 4 nm from the polymer without L, more preferably at least 8 nm, even more preferably at least 12 nm, and most preferably at least 20 nm. Because the wavelength scale is not linear in energy it may be preferable to use energy units where the emission spectrum of the polymer in the presence of L will have average energy in the visible range (400 nm to 650 nm) red-shifted by at least 0.025 eV from the polymer without L, more preferably at least 0.050 eV, even more preferably at least 0.075 eV, and most preferably at least 0.125 eV.

An example of such a comparison is given in McGehee et al. where a europium complex quenches the emission of a polyphenylene polymer. Examples are given of poor quenching and essentially complete quenching of photoluminescence (see FIG. 3 in McGehee et al.).

In other words, because the luminescent compound emits at lower energy than the STB repeat units, excited STB repeat units will transfer their energy to the luminescent compound. The reverse process is thermodynamically unfavorable and thus the excited state energy is funneled to the luminescent compound. If the STB repeat units have the lowest excited state energy of any of the repeat units in the chain then they may emit.

If L is a compound or repeat unit it may simply be omitted from the blend or polymer composition. It is noted that if L is part of the polymer (for example, as a repeat unit, a side group, or an end group) the comparison will necessarily be to a different polymer lacking any L groups or units, for example, if L is a side group or end group it may be replaced with H or phenyl. In the case that L is part of the polymer there may be other unavoidable changes that could also affect the emission spectrum, for example, molecular weight, or dis- Structure 22

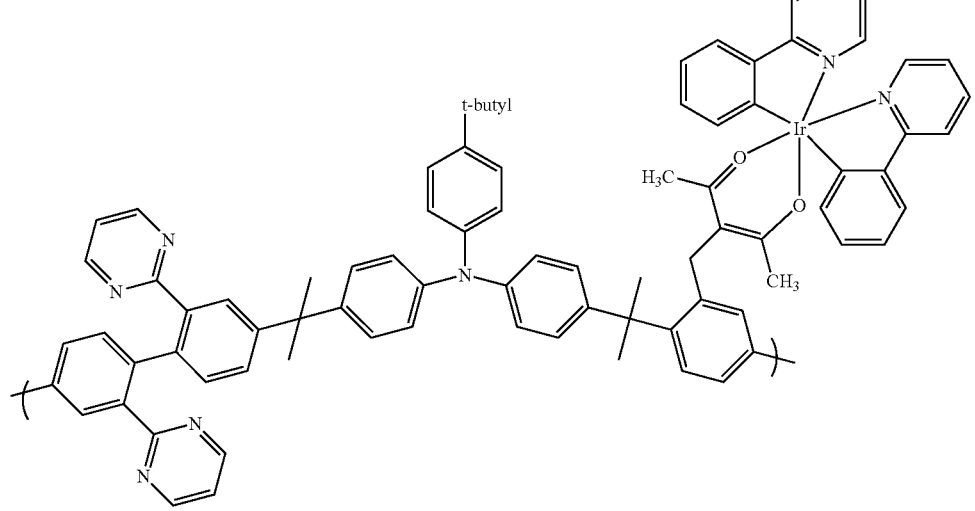

tance between STB units, however, typically the mol % L will be low and such effects will be minimal.

Another way to determine the ability of a luminescent compound, group or repeat unit L to be useful in the practice of the present invention is to compare the visible emission spectrum of a luminescent model compound L' having phenyl groups where the luminescent compound was attached to the polymer chain, with the visible emission spectrum of a STB model compound Ph-STB-Ph, having a single STB unit terminated with phenyl groups. L' will be identical to L where L is a compound not attached to the STB polymer chain. To be useful L must have a lower emission energy than Ph-STB-Ph.

Yet another method is to compare the spectra of L" and H-STB-H, where L" is a model of L terminated with H, and H-STB-H is a model of the STB unit terminated with H. The spectrum of L" should be lower in energy than the spectrum of H-STB-H.

The above methods for determining the if an L compound is useful in the practice of the present invention does not depend on any particular theory or mechanism of EL device operation. One theoretical argument suggests that in an EL device comprised of a high energy emitter and a low energy emitter, emission solely from the low energy emitter may result from transfer of excited state energy from high energy emitter to low energy emitter. An alternative theoretical argument suggests that emission solely from the low energy emitter may result from recombination of holes and electrons directly on the low energy emitter, and that transfer of excited state energy from high energy emitter to low energy emitter is not important. No matter which, if any, theory is correct, useful L may be selected by the methods described above.

In another embodiment the luminescent compound, unit, or group L, will be protected through incorporation of sterically bulky groups. The bulky groups protect L by preventing close approach to another L or polymer chain. The stabilizing effect of bulky groups is well known and it will be understood by one reasonably skilled in the art how to design a molecule L to have steric bulk.

In another embodiment the luminescent compound, unit or group L, will be protected through the placement of inert groups at active positions. For example, it is well known that the radical cation of triphenylamine is very reactive and reacts rapidly with neutral triphenylamine to form tetraphenylbenzidene. However, substitution of the three hydrogens para to the nitrogen with methyl results in the very stable tri-p-tolylamine radical cation.

It will be understood by one reasonably skilled in the art how to determine active positions in a material, for example, by alkylation and location of the alkyl groups, and to prepare protected versions of those materials. Protective groups include but are not limited to, alkyl, aryl, halo (preferably F and Cl), cyano, alkoxy, aryloxy, heteroalkyl, and heteroaryl.

Degradation will be lower if the polymer is below $T_g$ during use of the device. Thus L will be protected by use of relatively stiff repeat units and side chain, and avoiding flexible groups such as long alkyl chains.

The STB polymers of the instant invention may have repeat units, side groups or end groups that aid in charge transport. These repeat units or groups may aid electron transport or hole transport Non-limiting examples of hole transport units are triarylamines, benzidenes, and dialkoxyarenes. Some of the non-limiting examples of repeat unit Q shown above are good hole transport units. Non-limiting examples of electron transport units are oxadiazoles, benzoxazoles, perfluoroarenes, and quinolines. Some of the non-limiting examples of repeat unit Q shown above are good electron transport units. Any of the divalent structures shown for Q may be used as monovalent groups, e.g. end groups or side groups, by replacing one of the two linkages with —H or -Ph (i.e. phenyl). The amount of charge transport units or groups may vary from zero to 99%, preferably less than 75%, more preferably less than 50%. Useful amounts of charge transport groups include about 5 mol %, 10 mol %, 15 mol %, 20 mol %, 25 mol %, 30 mol % and 35 mol %. One skilled in the art will know how to prepare a series of polymers having various amounts of charge transport units and test their properties by measurement of charge mobility, for example, by time of flight measurement, or by measuring the efficiencies of p-OLEDs prepared from them. It has been suggested that a good luminescent layer will carry electrons and holes equally well, and it is desirable to adjust hole and electron mobility to be equal through addition or subtraction of charge transport units or groups.

The STB polymers of the instant invention may be used in layers of OLEDs and p-OLEDs other than the luminescent layer, for example, in a charge transport layer. As is known in the art, the charge carrying ability of a conjugated polymer may be enhanced by the incorporation of easily reducible repeat units (enhanced electron transport), or easily oxidizable repeat units (enhances hole transport), or both. Polymer compositions comprising easily oxidizable triarylamines are disclosed in U.S. Pat. No. 6,309,763 which is incorporated herein by reference. Polymer compositions comprising electron transport units are disclosed in U.S. Pat. No. 6,353,083 which is incorporated herein by reference. Additional carrier transporting repeat units useful in the practice of the present invention are disclosed in U.S. 2002/0064247 and U.S. 2003/0068527 also incorporated herein by reference.

The charge carrying layers of OLEDs and p-OLEDs may have additional functionality, for example, but not limited to, blocking charge carriers of the opposite type, blocking excitons, planarizing the structure, providing means for light to escape the device, and as buffer layers.

When used as any layer in an OLED or p-OLED the polymers and oligomers of the present invention may be blended or mixed with other materials, including but not limited to, polymeric or small molecule charge carriers, light scatterers, crosslinkers, surfactants, wetting agents, leveling agents, $T_g$ modifiers, and the like. For example, it may be desirable to blend an emissive polymer of the present invention with a hole transporting polymer. Or it may be desirable to blend a polymer of the present invention that emits at relatively high energy with a small molecule emitter or a polymeric emitter that also functions as an electron transport material.

The monomers of the present invention may be prepared by any methods known in the art. Patent application U.S. 2004/0135131 discloses many aryl compounds and their synthesis and is incorporated herein by reference.

The polymers of the instant invention may be prepared by any method of aryl coupling polymerization, including but not limited to, Colon reductive coupling of aryldihalides with zinc or other reducing metals catalyzed by nickel or other transition metal, Yamamoto reductive coupling of aryldihalides with an equivalent of nickel (O), Yamamoto coupling of aryl halides and aryl grignards with a nickel catalyst, Stille coupling of aryl halides with aryl tin reagents typically catalyzed with Pd, Suzuki coupling of aryl halides with aryl boronic acids or esters catalyzed with Pd metal, Pd complexes or salts, Negishi coupling of aryl halides with aryl zinc reagents typically catalyzed with Pd, Kumada catalytic coupling of aryl halides with aryl grignards or aryl lithium reagents, oxidative coupling of electron rich aryls as for example described in a review by Kovacic and Jones, Chemical Reviews, 1987, vol. 87, pp 357-379, and the like. Examples of Yamamoto and Colon coupling are disclosed in U.S. 2004/0170839 and U.S. 2002/0177687 which are incorporated herein by reference.

The polymers of the instant invention also may be prepared by any other methods, such as, but not limited to Diels-Alder type condensation of a bis-diene with a bis-dienophile as disclosed for example by Schilling et al, *Macromolecules*, Vol. 2, pp 85-88, 1969, incorporated herein by reference.

The polymers of the instant invention also may be prepared by graft and block methods, for example, wherein an intermediate polymer or oligomer is first formed and arms or chain extensions of another type of polymer are grown off the intermediate polymer. Graft co-polymers and block co-polymers may be useful, for example, to control the polymer morphology, or to prevent close approach of polymer chains, or crystallization. Grafts and blocks also may be used to control charge transport, for example, by incorporation of grafts or blocks of hole and/or electron transporting chains, Luminescent groups may be incorporated through the use of grafting or block copolymerization.

Monomers useful for the practice of the present invention include, but are not limited to, compositions represented by:

Structure 23

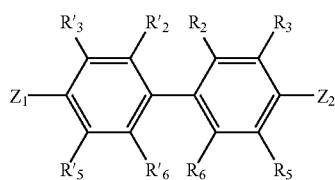

where $R_2$, $R_3$, $R_5$, $R_6$, $R'_2$, $R'_3$, $R'_5$, and $R'_6$ are as defined above, $R_m$ may be independently hydrogen, alkyl, substituted alkyl, aryl, substituted aryl, heteroaryl, and substituted heteroaryl; $R_n$ may be independently alkylene, substituted alkylene, and 1,2-arylene; $Z_1$ and $Z_2$ are independently chosen from the group consisting of halogen atoms, —ArCl, —ArBr, —ArI, —COR$_m$, ArCOR$_m$, boron dihalides, borontrihalide salts, boronic acids, boronic esters, where the boronic acids or esters may be, but are not limited to

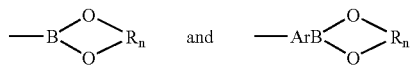

Non-limiting examples of $R_m$ are ethyl, phenyl, and 2-pyridyl. Non-limiting examples of $R_n$ are ethylene (—CH$_2$CH$_2$—), propylene (—CH$_2$CH$_2$CH$_2$—), tetramethylethylene, and 1,2-phenylene. A non-limiting example of a borontrihalide salt is the tetrabutylammonium salt of —BF$_3$ (–).

Monomers useful for preparing the polymers of the present invention include:

Structure 24

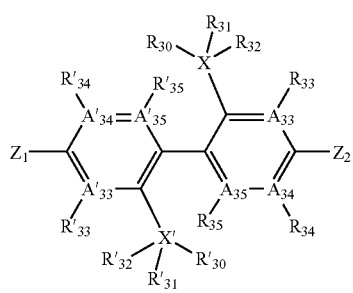

where $Z_1$ and $Z_2$ are independently chosen from the group consisting of halogen atoms, —ArCl, —ArBr, —ArI, —COR$_m$, ARCOR$_m$, B(OR$_m$)$_2$, —ArB(OR$_m$)$_2$,

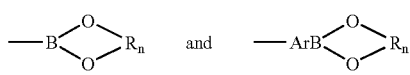

wherein m, n, Ar, X, X', $A_{33}$-$A_{35}$, $A'_{33}$-$A'_{35}$, $R_{30}$-$R_{35}$, and $R'_{30}$-$R'_{35}$, are as defined above.

Monomers may be prepared by any method. For example,

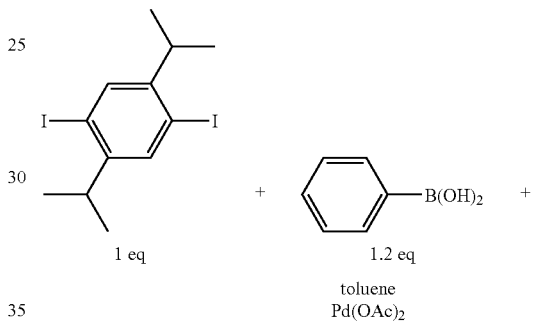

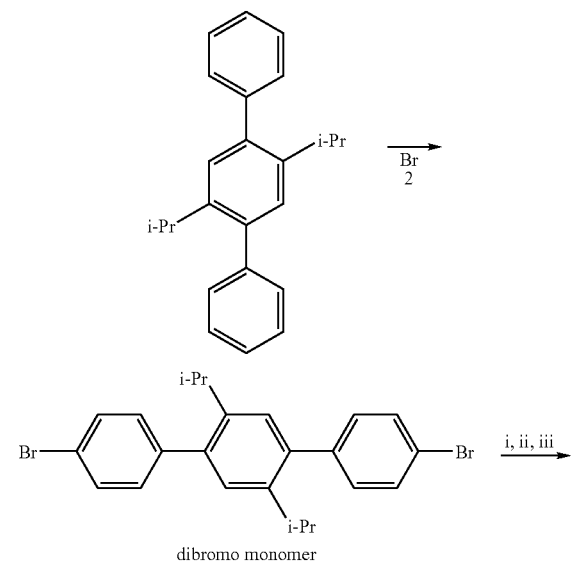

dibromo monomer

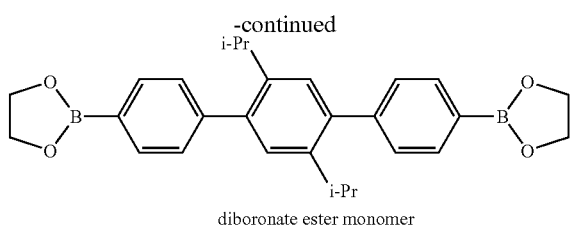

diboronate ester monomer i n-BuLi, THF -80° C.
ii a. (BOMe)₃, b. H₂O
iii ethylene glycol, -H₂O terphenyl monomers may be prepared by Suzuki coupling followed by bromination to dibromomonomer and conversion of the dibromide into the diboronic ester. The known 1,4-diiodo-2,5-diisopropylbenzene may also be used as a monomer, or converted to a diboronic acid or ester. The known 4,4"-dibromoterphenyl may be alkylated or dialkylated to give a dibromo monomer, and this may be converted to a diboronic acid or ester monomer. Other monomers and their method of preparation will be apparent to one reasonably skilled in the art.

Any of the dibromo-monomers may be polymerized with, for example, toluene 2,5-bis(1,3,2-dioxaborolane-2-yl), and 4-t-butyl-4',4"-dibromotriphenylamine (typically 5 to 20 mol %) using Pd(PPh₃)₄ (0.5 mol %) and Na₂CO₃ (2 eq) in toluene/water or in dimethylacetamide. It is preferred to add benzene boronic acid as an endcap.

It is desirable for the polymers of the present invention to have good electron and hole transport properties. It is therefore desirable to use co-polymers comprising STB units and good hole transporting and/or electron transporting units. Good hole transporting units will be relatively easy to oxidize, show reversible electrochemistry, and be relatively stable in the oxidized state. Hole transport units should have higher bandgap than the emitter. Preferably the hole transport unit will impart upon the polymer a reversible oxidation in the range of 0.2 to 2 V vs the Ag/AgNO₃ reference electrode (about 1 to 2.8 V vs the normal hydrogen electrode (NHE)) when measured, for example, by cyclic voltammetry (CV), either in solution or as a film in an electrolyte that can swell the film (for example acetonitrile), and at a scan rate of about 10 mV/sec. Preferably the CV peak-to-peak separation will be less than 80 mV, more preferably less than 70 mV and most preferably less than 60 mV.

Electron transport units should be relatively easy to reduce, show reversible electrochemistry, have higher bandgap than the emitter, and be relatively stable in the reduced state. Preferably the hole transport unit will impart upon the polymer a reversible oxidation in the range of between −1.3 and −2.8V vs the Ag/AgNO₃ reference electrode (about −0.5 to −2 V vs NHE when measured, for example, by cyclic voltammetry (CV), either in solution or as a film in an electrolyte that can swell the film, and at a scan rate of about 10 mV/sec. More preferably in the range −1.5 to −2.5 V vs Ag/AgNO₃. Preferably the CV peak-to-peak separation will be less than 80 mV, more preferably less than 70 mV and most preferably less than 60 mV.

As used herein luminescent means the property of emitting light upon stimulation. Stimulation may be by electromagnetic radiation of any frequency, including visible light (photoluminescent), X-rays, gamma rays, infra-red, and ultraviolet, by electron beam, by heat or by any other energy source. Luminescent and photoluminescent include fluorescent and phosphorescent Fluorescence is luminescence having a short decay time, and generally refers to luminescence from an excited singlet state to the ground state, or any highly allowed transition. Phosphorescence is luminescence having a long decay time, and generally refers to luminescence from an excited triplet state to a singlet ground state, or to a forbidden transition.

As used herein the term transition metals includes group IIIB, IVB, VB, VIB, VIIB, VIII, IB and IIB elements.

As is well known in the art most polymers may be subdivided into repeat units in more than one way. For the polyarylenes of the present invention it is sometimes convenient to divide the polymer into simple arylene units, and sometimes into biaryl units. The heuristic division into biaryl units helps to visualize the twisting of two adjacent aryl units by their ortho substituents. The scope of the present invention is in no way limited by the particular selection of repeat units discussed here. Likewise, a given polymer may often result from more than one set of monomers. The scope of the present invention is in no way limited by the particular selection of monomers used in the examples.

Dyad as used herein refers to two aryl repeat units, where the ortho substituents are those ortho to the bond joining the two aryl units. In counting dyads in a polyarylene each aryl unit will appear in two dyads.

A secondary carbon is one which is directly bonded to exactly two other carbon atoms: A tertiary carbon is one which is directly bonded to exactly three other carbon atoms. A quaternary carbon is one which is directly bonded to exactly four other carbon atoms.

Although the present invention has been described in terms of preferred and alternate embodiments, it is intended that the present invention encompass all modifications and variations that occur to those skilled in the art, upon consideration of the disclosure herein, those embodiments that are within the broadest proper interpretation of the claims and their requirements.

The invention claimed is:

1. A polymer composition comprising one type of repeat unit selected from the group consisting of:

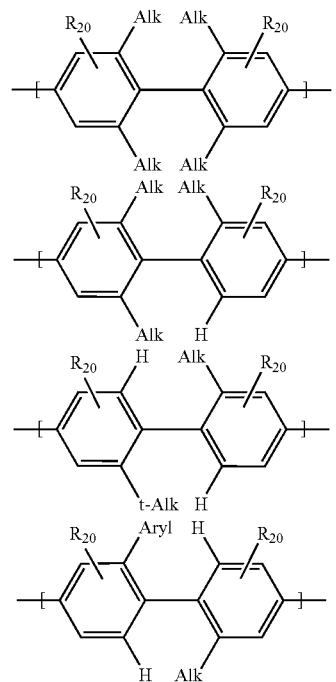

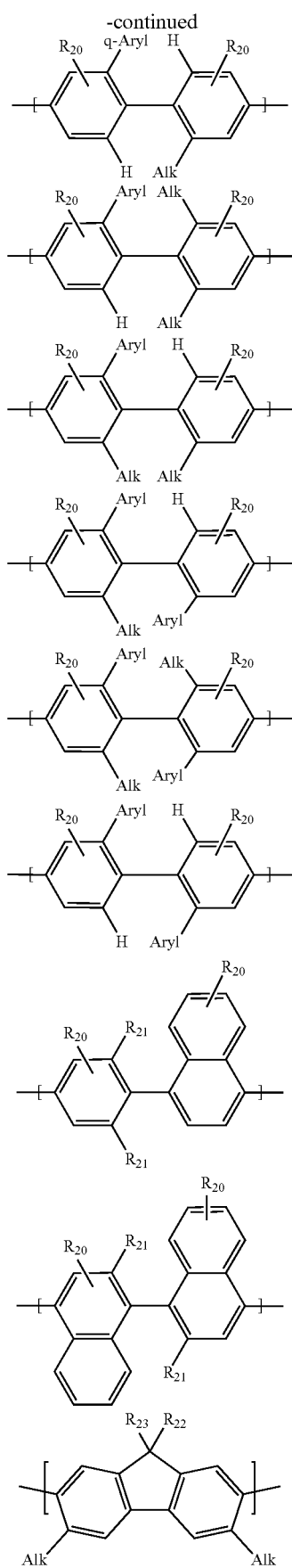

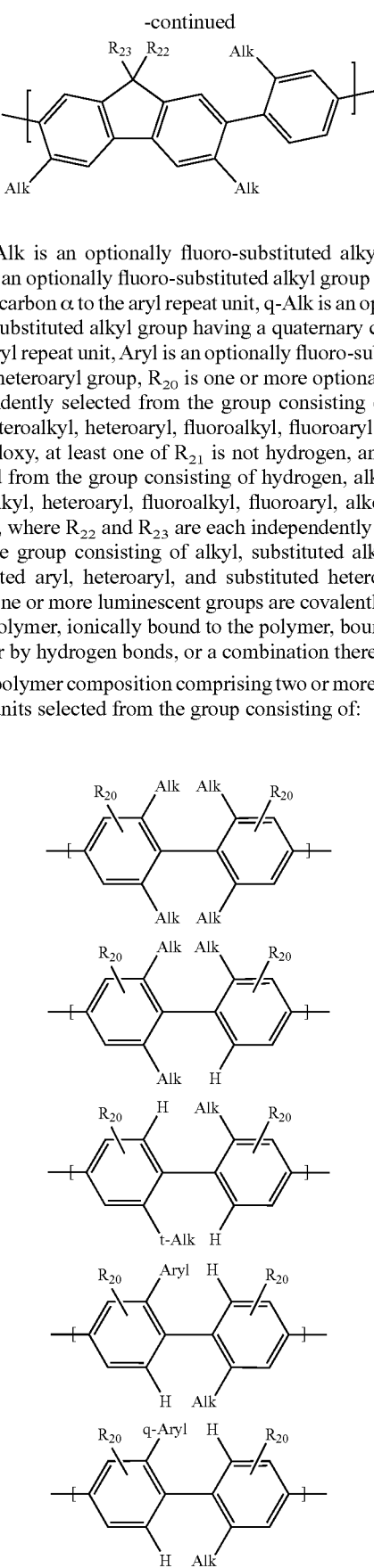

where Alk is an optionally fluoro-substituted alkyl group, t-Alk is an optionally fluoro-substituted alkyl group having a tertiary carbon α to the aryl repeat unit, q-Alk is an optionally fluoro-substituted alkyl group having a quaternary carbon α to the aryl repeat unit, Aryl is an optionally fluoro-substituted aryl or heteroaryl group, $R_{20}$ is one or more optional groups independently selected from the group consisting of alkyl, aryl, heteroalkyl, heteroaryl, fluoroalkyl, fluoroaryl, alkoxy, and aryloxy, at least one of $R_{21}$ is not hydrogen, and $R_{21}$ is selected from the group consisting of hydrogen, alkyl, aryl, heteroalkyl, heteroaryl, fluoroalkyl, fluoroaryl, alkoxy, and aryloxy, where $R_{22}$ and $R_{23}$ are each independently selected from the group consisting of alkyl, substituted alkyl, aryl, substituted aryl, heteroaryl, and substituted heteroaryl, in which one or more luminescent groups are covalently bound to the polymer, ionically bound to the polymer, bound to the polymer by hydrogen bonds, or a combination thereof.

2. A polymer composition comprising two or more types of repeat units selected from the group consisting of:

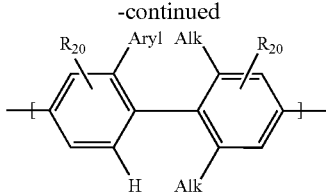
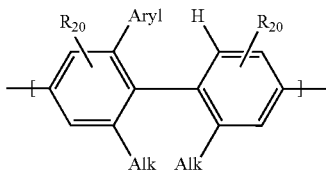
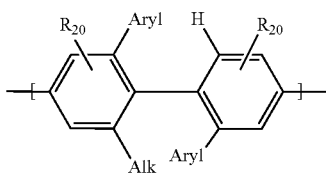
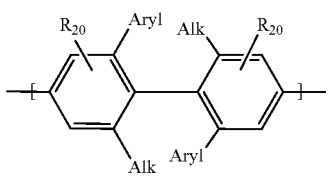
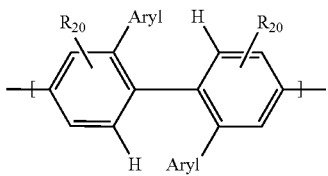
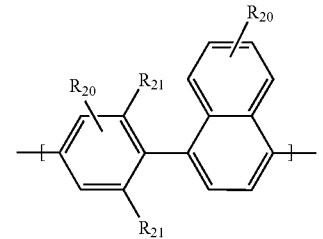
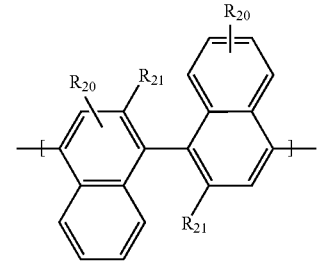
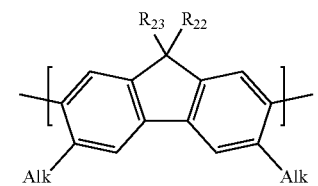

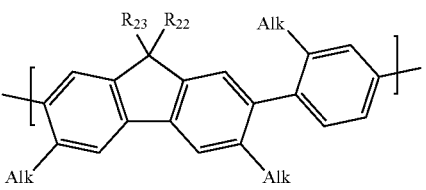

where Alk is an optionally fluoro-substituted alkyl group, t-Alk is an optionally fluoro-substituted alkyl group having a tertiary carbon α to the aryl repeat unit, q-Alk is an optionally fluoro-substituted alkyl group having a quaternary carbon α to the aryl repeat unit, Aryl is an optionally fluoro-substituted aryl or heteroaryl group, $R_{20}$ is one or more optional groups independently selected from the group consisting of alkyl, aryl, heteroalkyl, heteroaryl, fluoroalkyl, fluoroaryl, alkoxy, and aryloxy, at least one of $R_{21}$ is not hydrogen, and $R_{21}$ is selected from the group consisting of hydrogen, alkyl, aryl, heteroalkyl, heteroaryl, fluoroalkyl, fluoroaryl, alkoxy, and aryloxy, where $R_{22}$ and $R_{23}$ are each independently selected from the group consisting of alkyl, substituted alkyl, aryl, substituted aryl, heteroaryl, and substituted heteroaryl, in which one or more luminescent groups are covalently bound to the polymer, ionically bound to the polymer, bound to the polymer by hydrogen bonds, or a combination thereof.

3. A copolymer composition comprising 1-99% by weight of one type of repeat unit selected from the group consisting of:

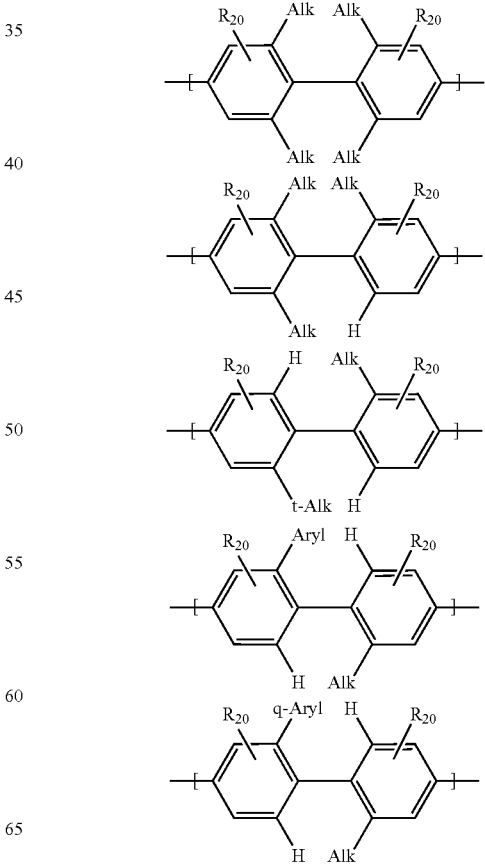

-continued

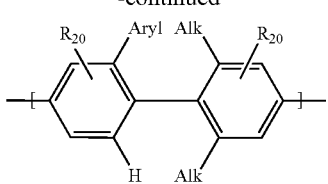
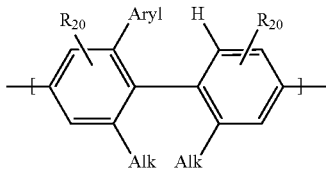
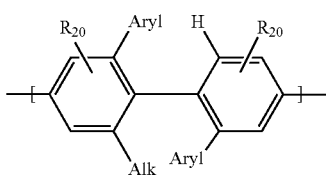
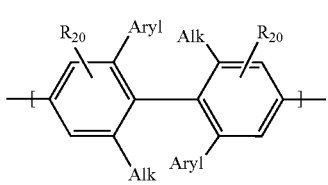
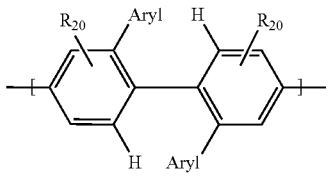
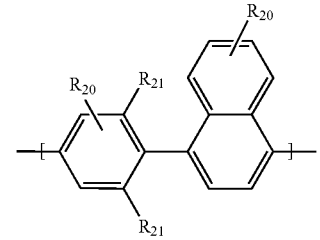
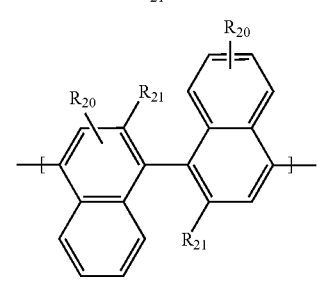
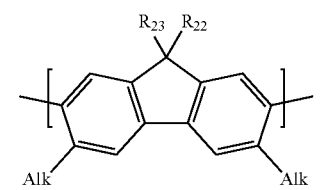

-continued

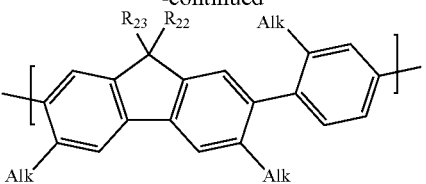

where Alk is an optionally fluoro-substituted alkyl group, t-Alk is an optionally fluoro-substituted alkyl group having a tertiary carbon α to the aryl repeat unit, q-Alk is an optionally fluoro-substituted alkyl group having a quaternary carbon α to the aryl repeat unit, Aryl is an optionally fluoro-substituted aryl or heteroaryl group, $R_{20}$ is one or more optional groups independently selected from the group consisting of alkyl, aryl, heteroalkyl, heteroaryl, fluoroalkyl, fluoroaryl, alkoxy, and aryloxy, at least one of $R_{21}$ is not hydrogen, and $R_{21}$ is selected from the group consisting of hydrogen, alkyl, aryl, heteroalkyl, heteroaryl, fluoroalkyl, fluoroaryl, alkoxy, and aryloxy, where $R_{22}$ and $R_{23}$ are each independently selected from the group consisting of alkyl, substituted alkyl, aryl, substituted aryl, heteroaryl, and substituted heteroaryl, in which one or more luminescent groups are covalently bound to the polymer, ionically bound to the polymer, bound to the polymer by hydrogen bonds, or a combination thereof;

and comprising 1-99% by weight of one or more types of repeating units independently selected from the group of conjugated units of the formulas

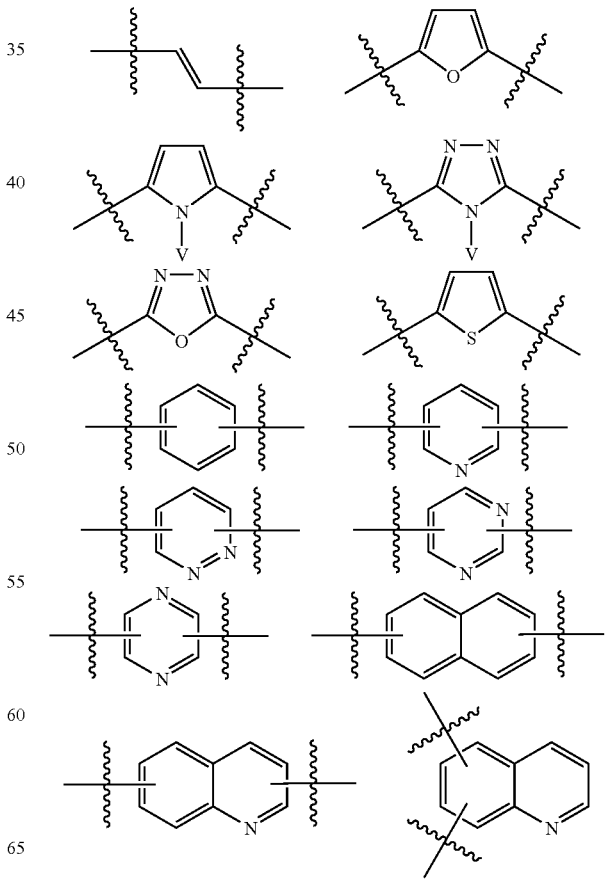

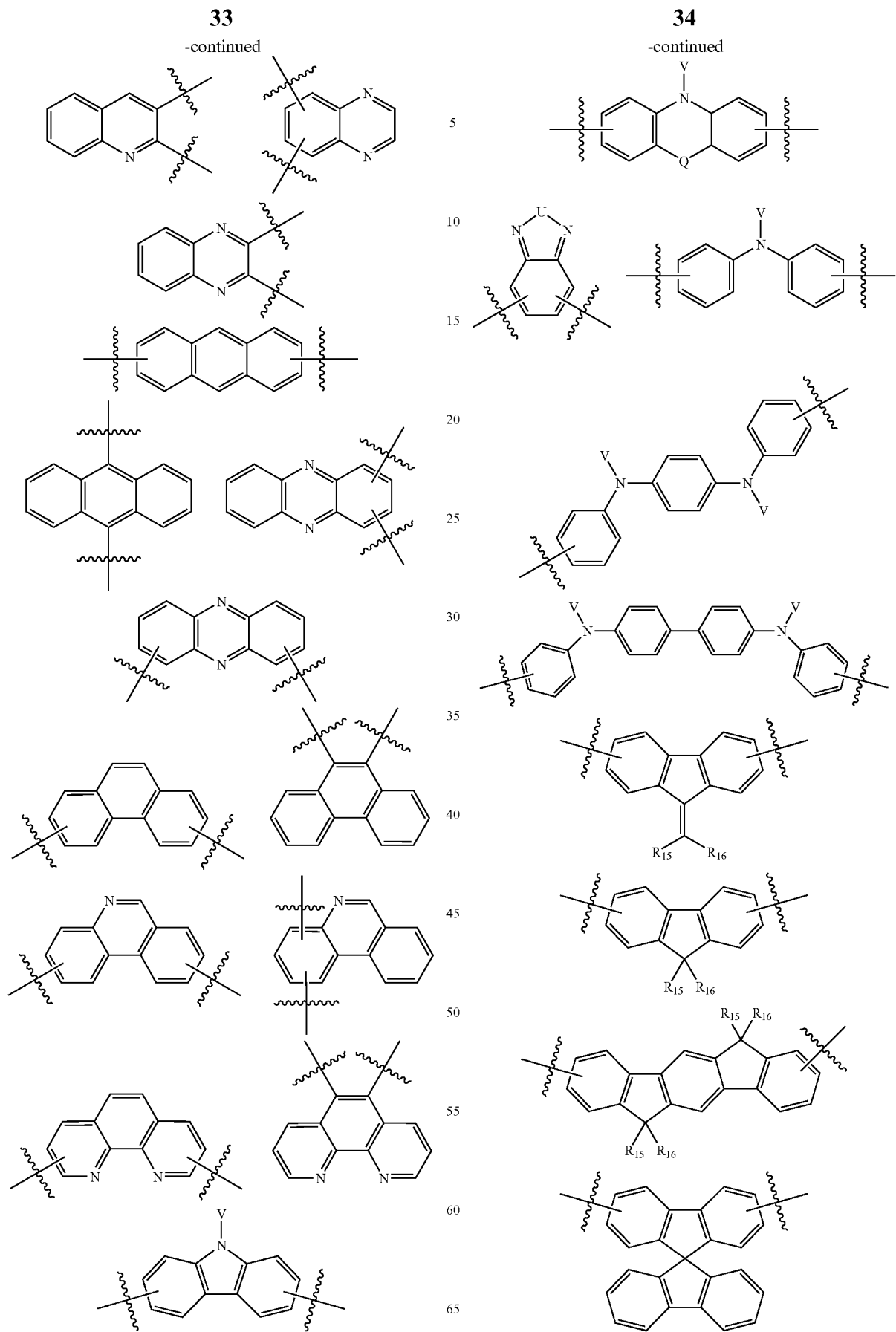

-continued

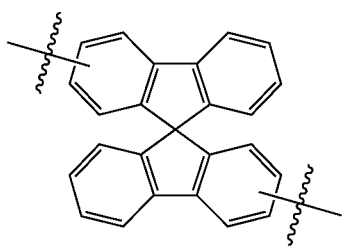

wherein the conjugated units may bear substitutents independently chosen from the group consisting of alkyl, substituted alkyl, perfluoro alkyl, alkoxy, substituted alkoxy, aryl, substituted aryl, aryloxy, substituted aryloxy, heteroaryl, substituted heteroaryl, alkyl carbonyloxy, cyano, and fluoro in which U is —O— or —S— and V, $R_{15}$, and $R_{16}$ are each independently chosen from the group consisting of alkyl, substituted alkyl, aryl, substituted aryl, heteroaryl, substituted heteroaryl, arylalkyl, substituted arylalkyl, heteroarylalkyl and substituted heteroarylalkyl.

4. A copolymer composition comprising 1-99% by weight of two or more types of repeat units selected from the group consisting of:

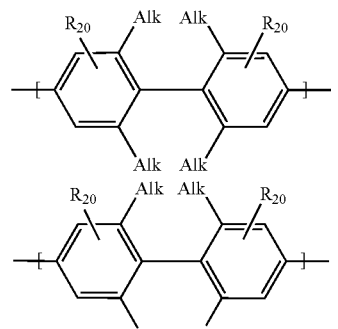

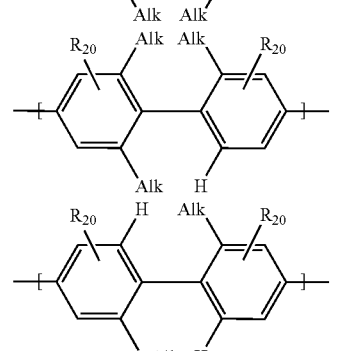

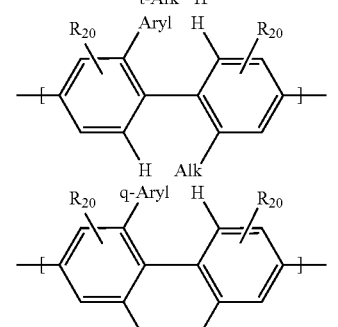

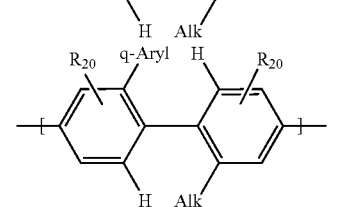

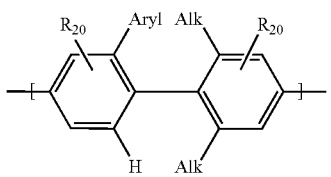

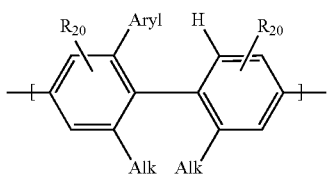

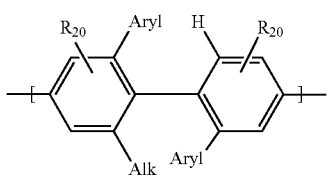

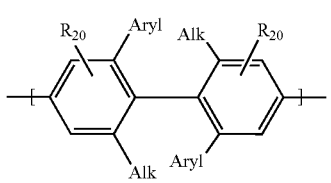

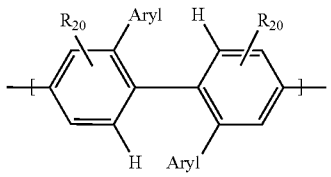

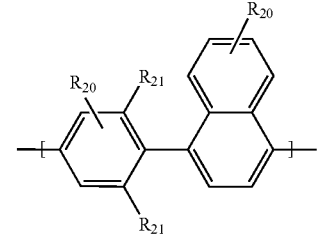

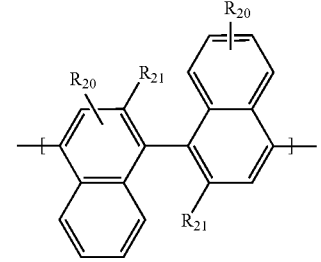

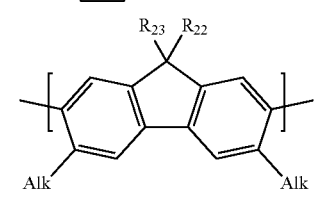

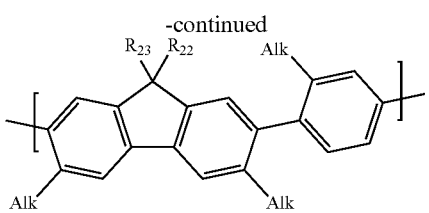

where Alk is an optionally fluoro-substituted alkyl group, t-Alk is an optionally fluoro-substituted alkyl group having a tertiary carbon α to the aryl repeat unit, q-Alk is an optionally fluoro-substituted alkyl group having a quaternary carbon α to the aryl repeat unit, Aryl is an optionally fluoro-substituted aryl or heteroaryl group, $R_{20}$ is one or more optional groups independently selected from the group consisting of alkyl, aryl, heteroalkyl, heteroaryl, fluoroalkyl, fluoroaryl, alkoxy, and aryloxy, at least one of $R_{21}$ is not hydrogen, and $R_{21}$ is selected from the group consisting of hydrogen, alkyl, aryl, heteroalkyl, heteroaryl, fluoroalkyl, fluoroaryl, alkoxy, and aryloxy, where $R_{22}$ and $R_{23}$ are each independently selected from the group consisting of alkyl, substituted alkyl, aryl, substituted aryl, heteroaryl, and substituted heteroaryl, in which one or more luminescent groups are covalently bound to the polymer, ionically bound to the polymer, bound to the polymer by hydrogen bonds, or a combination thereof;

and comprising 1-99% by weight of one or more types of repeating units independently selected from the group of conjugated units of the formulas:

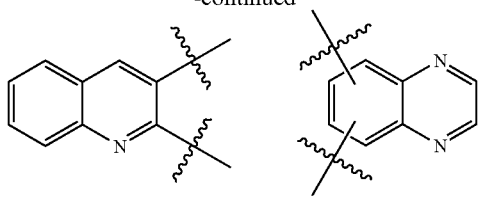

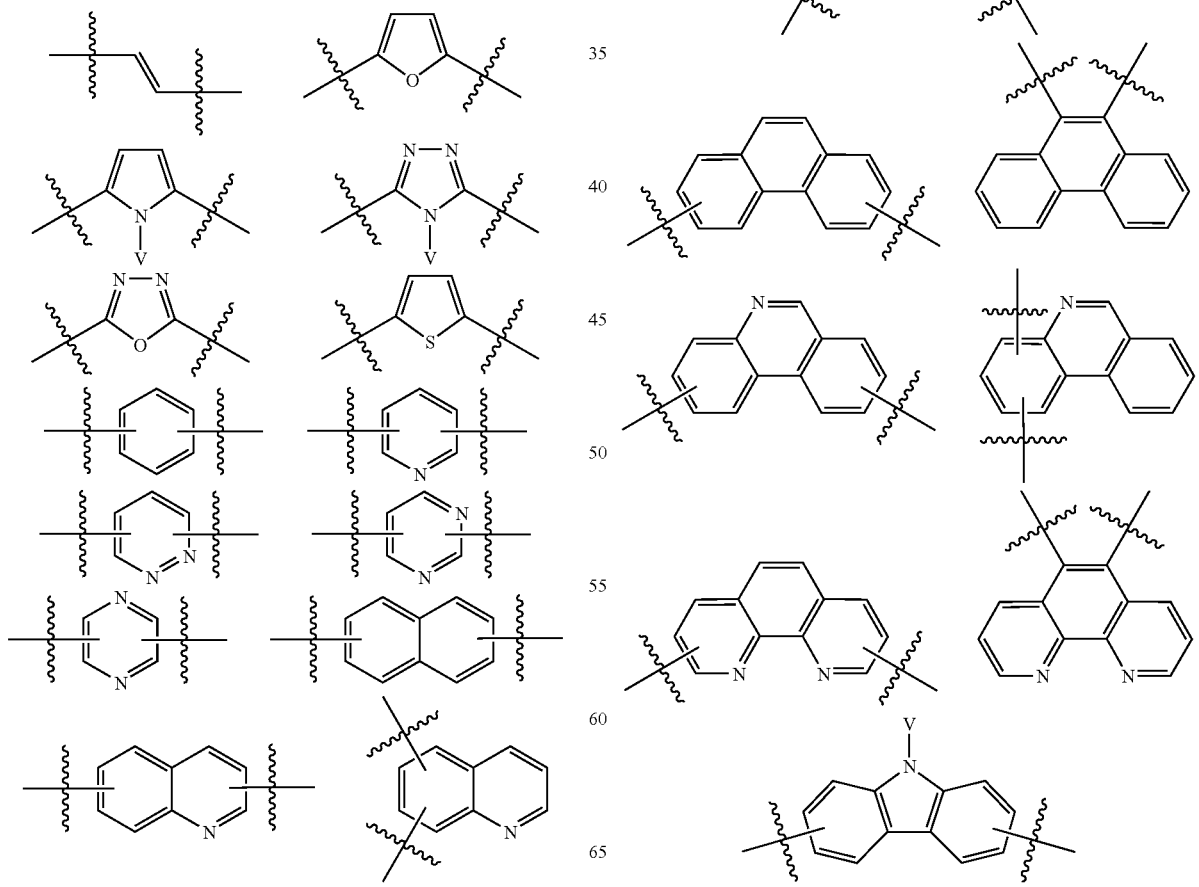

-continued

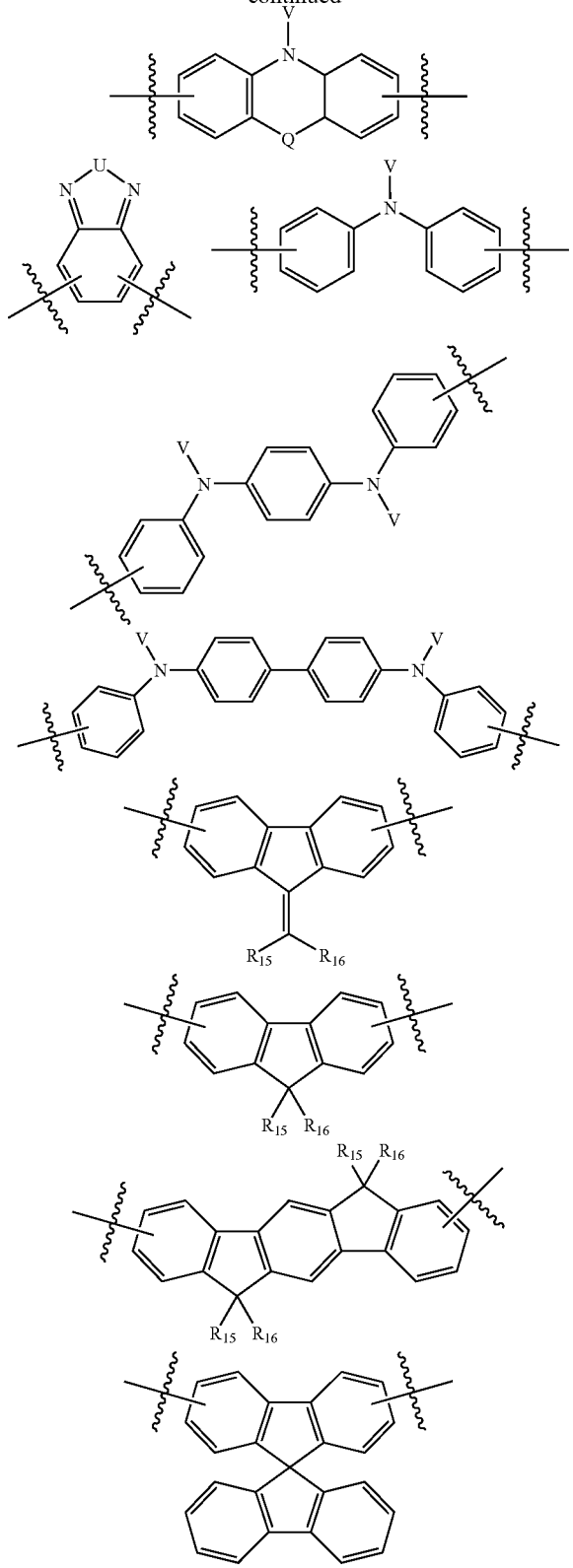

-continued

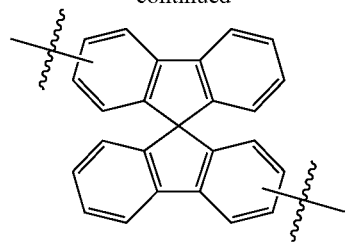

wherein the conjugated units may bear substitutents independently chosen from the group consisting of alkyl, substituted alkyl, perfluoro alkyl, alkoxy, substituted alkoxy, aryl, substituted aryl, aryloxy, substituted aryloxy, heteroaryl, substituted heteroaryl, alkyl carbonyloxy, cyano, and fluoro in which U is —O— or —S— and V, $R_{15}$, and $R_{16}$ are each independently chosen from the group consisting of alkyl, substituted alkyl, aryl, substituted aryl, heteroaryl, substituted heteroaryl, arylalkyl, substituted arylalkyl, heteroarylalkyl and substituted heteroarylalkyl.

5. The composition of claim 1 in which one or more of the alkyl groups Alk, t-Alk, and q-Alk or aryl groups Aryl are singly fluoro substituted, multiply fluoro substituted, or perfluoro substituted at one or more positions.

6. The composition of claim 1 in which one or more of V, $R_{15}$, and $R_{16}$ are singly fluoro substituted, multiply fluoro substituted, or perfluoro substituted at one or more positions.

7. The composition of claim 1 further comprising endcapping groups comprising an aromatic group.

8. The composition of claim 1 wherein the polymer has a structure that is linear, branched, hyperbranched, star, comb, dendritic, or a combination thereof.

9. The composition of claim 1 wherein the polymer has a structure that is alternating, random, block, or a combination thereof.

10. The composition of claim 1 in which the polymer contains crosslinkable functional groups.

11. The composition of claim 1 in which the polymer contains chemically reactive end groups that can be used to increase the molecular weight of the material.

12. The composition of claim 1 in which one or more metals are chelated to the polymer, covalently bound to the polymer, ionically bound to the polymer, bound to the polymer by hydrogen bonds, or a combination thereof.

13. The composition of claim 12 in which the metal is independently chosen from the group consisting of transition metals.

14. A composition comprising a blend of one or more of the polymers of claim 1 and one or more other polymers.

15. An organic light emitting diode comprising the composition of claim 1.

* * * * *